United States Patent
Kim et al.

(10) Patent No.: US 9,608,114 B2
(45) Date of Patent: Mar. 28, 2017

(54) SEMICONDUCTOR DEVICE INCLUDING FIELD EFFECT TRANSISTORS

(71) Applicant: SAMSUNG ELECTRONICS CO., LTD., Suwon-si, Gyeonggi-do (KR)

(72) Inventors: Dongwoo Kim, Incheon (KR); Seung Hun Lee, Hwaseong-si (KR); Sunjung Kim, Suwon (KR); Hyun Jung Lee, Suwon-si (KR); Bonyoung Koo, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/989,956

(22) Filed: Jan. 7, 2016

(65) Prior Publication Data

US 2016/0293763 A1   Oct. 6, 2016

(30) Foreign Application Priority Data

Apr. 3, 2015  (KR) .................. 10-2015-0047581

(51) Int. Cl.

| | |
|---|---|
| *H01L 29/78* | (2006.01) |
| *H01L 29/10* | (2006.01) |
| *H01L 29/165* | (2006.01) |
| *H01L 29/06* | (2006.01) |
| *H01L 27/088* | (2006.01) |

(52) U.S. Cl.
CPC ...... *H01L 29/7849* (2013.01); *H01L 27/0886* (2013.01); *H01L 29/0649* (2013.01); *H01L 29/1054* (2013.01); *H01L 29/165* (2013.01); *H01L 29/785* (2013.01)

(58) Field of Classification Search
CPC ............ H01L 29/7849; H01L 29/1054; H01L 29/165; H01L 29/785; H01L 27/0886; H01L 29/0649; H01L 21/823431; H01L 21/823821; H01L 21/845
See application file for complete search history.

(56) References Cited

U.S. PATENT DOCUMENTS

| | | |
|---|---|---|
| 7,671,420 B2 | 3/2010 | Shin et al. |
| 7,723,193 B2 | 5/2010 | Rhee et al. |
| 7,767,560 B2 | 8/2010 | Jin et al. |
| 8,263,451 B2 | 9/2012 | Su et al. |
| 8,310,013 B2 | 11/2012 | Lin et al. |
| 8,362,574 B2 | 1/2013 | Kawasaki et al. |
| 8,624,320 B2 | 1/2014 | Schultz |
| 8,729,627 B2 | 5/2014 | Cheng et al. |
| 8,901,607 B2 | 12/2014 | Wang et al. |
| 9,024,368 B1 * | 5/2015 | Yu ................. H01L 29/7848 257/288 |
| 2009/0179226 A1 * | 7/2009 | Teo ................. H01L 21/76254 257/190 |

(Continued)

*Primary Examiner* — Jarrett Stark
*Assistant Examiner* — Bitew Dinke
(74) *Attorney, Agent, or Firm* — Lee & Morse P.C.

(57) ABSTRACT

A semiconductor device includes a buffer layer on a substrate, the buffer layer having a lattice constant different from that of the substrate, a fin structure upwardly protruding from the buffer layer, a gate electrode crossing over the fin structure, a cladding layer at a side of the fin structure and covering a top surface and sidewalls of the fin structure, and an interfacial layer between the cladding layer and the fin structure, the interfacial layer including a same element as the buffer layer.

25 Claims, 15 Drawing Sheets

(56) References Cited

U.S. PATENT DOCUMENTS

| | | | |
|---|---|---|---|
| 2012/0168877 A1* | 7/2012 | Mukherjee | H01L 29/66446 257/401 |
| 2012/0319211 A1* | 12/2012 | van Dal | H01L 29/66795 257/401 |
| 2013/0234204 A1* | 9/2013 | Kang | H01L 29/7851 257/190 |
| 2013/0341638 A1* | 12/2013 | Liao | H01L 29/66484 257/77 |
| 2014/0175512 A1* | 6/2014 | Chu-Kung | H01L 21/82382 257/190 |
| 2015/0102411 A1* | 4/2015 | Ching | H01L 21/76205 257/347 |
| 2015/0123210 A1* | 5/2015 | Liao | H01L 29/785 257/401 |
| 2015/0137263 A1* | 5/2015 | Lee | H01L 29/785 257/401 |
| 2015/0170916 A1* | 6/2015 | Yu | H01L 21/02664 438/493 |
| 2015/0214370 A1* | 7/2015 | Kim | H01L 29/7853 257/401 |
| 2016/0027876 A1* | 1/2016 | Lee | H01L 29/1054 257/369 |
| 2016/0079367 A1* | 3/2016 | Yoo | H01L 29/1054 257/77 |
| 2016/0197075 A1* | 7/2016 | Li | H01L 27/0924 257/369 |

* cited by examiner

SEMICONDUCTOR DEVICE INCLUDING FIELD EFFECT TRANSISTORS

CROSS-REFERENCE TO RELATED APPLICATION

This application claims priority from Korean Patent Application No. 10-2015-0047581, filed on Apr. 3, 2015, in the Korean Intellectual Property Office, the disclosure of which is incorporated by reference herein in its entirety.

BACKGROUND

1. Field

Example embodiments relate to a semiconductor device, and in particular, to a semiconductor device including fin field effect transistors.

2. Description of Related Art

A semiconductor device may include integrated circuits (ICs) consisting of metal-oxide-semiconductor field-effect transistors (MOS-FETs). As a reduction in size and design rule of the semiconductor device is accelerated, the MOS-FETs are increasingly being scaled down. The reduction in size of the MOS-FET may lead to deterioration in operational properties of the semiconductor device. Accordingly, varieties of studies are conducted to overcome technical limitations associated with the scale-down of the semiconductor device and provide a relatively high performance semiconductor device.

SUMMARY

Example embodiments provide a semiconductor device having improved channel characteristics and methods for manufacturing the same.

Example embodiments also provide a semiconductor device having a highly improved reliability and methods for manufacturing the same.

According to example embodiments, a semiconductor device may include a buffer layer on a substrate, the buffer layer having a lattice constant different from that of the substrate; a fin structure upwardly protruding from the buffer layer; a gate electrode crossing over the fin structure; a cladding layer provided at a side of the fin structure and covering a top surface and sidewalls of the fin structure; and an interfacial layer between the cladding layer and the fin structure, the interfacial layer including a same element as that of the buffer layer.

In some example embodiments, the fin structure may include a buffer pattern upwardly protruding from the buffer layer and extending in a direction; an active pattern on the buffer pattern and extending in the direction, the active pattern having a lattice constant different from that of the buffer pattern. The buffer pattern may be disposed between the active pattern and the buffer layer.

In some example embodiments, the fin structure may include a first part under the gate electrode and the second part at a side of the gate electrode. A top surface of the first part may be substantially coplanar with a top surface of the second part. The cladding layer may be provided on the second part to cover a top surface and sidewalls of the active pattern. The interfacial layer may be interposed between the cladding layer and the second part of the active pattern.

In some example embodiments, the buffer pattern may include material having a same lattice constant as that of the buffer layer. The buffer pattern and the buffer layer may provide a tensile stress to the active pattern.

In some embodiments, the interfacial layer may include an element different from an element that constitutes each of the active pattern and the cladding layer.

In some example embodiments, the active pattern and the cladding layer may include silicon, and the interfacial layer and the buffer layer may include germanium.

In some example embodiments, the buffer pattern may include material having a same lattice constant as that of the buffer layer. The buffer layer and the buffer pattern provide a compressive stress to the active pattern.

In some example embodiments, the active pattern, the cladding layer, the interfacial layer, and the buffer layer may include germanium. A germanium content of the interfacial layer may be higher than that of each of the active pattern and the cladding layer.

In some example embodiments, a germanium content of the buffer layer may be lower than that of the active pattern.

According to other example embodiments, a semiconductor device may include a fin structure protruding from a lower layer and extending in a first direction; isolation layers disposed at both sides of the fin structure and extending in the first direction; a gate electrode crossing over the fin structure and extending in a second direction across the first direction; cladding layers provided on the fin structure at the both sides of the gate electrode; and an interfacial layer interposed between the fin structure and each of the cladding layers and not provided between the gate electrode and the fin structure. The fin structure may include a first part under the gate electrode and second parts at the both sides of the gate electrode. Each of the cladding layers may be provided on each of the second parts. A top surface of the first part may be substantially coplanar with top surfaces of the second parts.

In some example embodiments, each of the second parts of the fin structures may include sidewalls exposed by the isolation layers. Each of the cladding layers may cover the top surface and the sidewalls of the second parts. The interfacial layer may be interposed between each of the cladding layers and each of the second parts and may not be interposed between the first part and the gate electrode.

In some example embodiments, the lower layer may comprise a substrate and a buffer layer having a lattice constant different from that of the substrate and disposed on the substrate. The fin structure may include an active pattern extending in the first direction and having a lattice constant different from the buffer layer and a buffer pattern connected to the buffer layer. The buffer pattern may be disposed between the active pattern and the buffer layer, and the isolation layers may expose at least a portion of the active pattern.

In some example embodiments, the active pattern may comprise a first region under the gate electrode and second regions at the both sides of the gate electrode. Each of the second regions may have a top surface and sidewalls exposed by the isolation layers. Each of the cladding layers may cover the top surface and the sidewalls of each of the second regions. The interfacial layer may be interposed between each of the cladding layers and each of the second regions and may be disposed on the top surface and the sidewalls of each of the second regions.

In some example embodiments, the interfacial layer may include a same element as that of the buffer pattern.

In some example embodiments, the buffer pattern may provide a tensile stress to the active pattern. The active pattern and the cladding layers may include a first element. The interfacial layer and the buffer pattern may include a second element different from the first element.

In some example embodiments, the first element may be silicon, and the second element may be germanium.

In some example embodiments, the buffer pattern may provide a compressive stress to the active pattern. The active pattern, the cladding layers, the interfacial layer, and the buffer pattern may include a first element, respectively. The first element content of the interfacial layer is higher than that of each of the active pattern and the cladding layers.

In some example embodiments, the first element may be germanium

In some example embodiments, the device may further comprise capping layers provide on the cladding layers, respectively. The cladding layers and the capping layers may include a second element different from the first element. A second element content of each of the capping layers may be higher than that of each of the cladding layers.

In some example embodiments, the second element may be silicon.

According to still other example embodiments, a semiconductor device may include a buffer layer on a substrate, the buffer layer having a lattice constant different from that of the substrate, a fin structure upwardly protruding from the buffer layer, the fin structure including a buffer pattern at a bottom of the fin structure and extending upwardly from the buffer layer, and an active pattern on the buffer pattern, the active pattern having a lattice constant different from that of the buffer pattern, a gate electrode crossing over the fin structure, a cladding layer covering portions of a top surface and sidewalls of the fin structure, and an interfacial layer between the cladding layer and the fin structure, the interfacial layer including a same material as the buffer layer.

In some example embodiments, the interfacial layer may be directly between the cladding layer and the fin structure, the cladding layer being an epitaxial layer at opposite sides of the gate electrode.

In some example embodiments, the cladding layer may completely cover a top surface and sidewalls of the active pattern, the interfacial layer completely separating between the cladding layer and the active pattern.

In some example embodiments, the buffer pattern may be integral with and consists of a same material as the buffer layer, the lattice constant of the active pattern being smaller than that of the buffer pattern.

In some example embodiments, the active pattern and the cladding layer may include a same material, at least a portion of the cladding layer defining a source/drain region, and the interfacial layer may include a different material than the active pattern and the cladding layer.

According to yet other example embodiments, a method of manufacturing a semiconductor device may include forming a buffer layer on a substrate, the buffer layer having a lattice constant different from that of the substrate; forming a fin structure upwardly protruding from the buffer layer; forming a gate electrode crossing over the fin structure; forming a cladding layer at a side of the fin structure to cover a top surface and sidewalls of the fin structure; and forming an interfacial layer between the cladding layer and the fin structure, the interfacial layer including a same element as that of the buffer layer.

In some example embodiments, the element of the interfacial layer may be germanium.

In some example embodiments, the forming an interfacial layer may include performing a thermal treatment process or a plasma treatment process on the fin structure.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
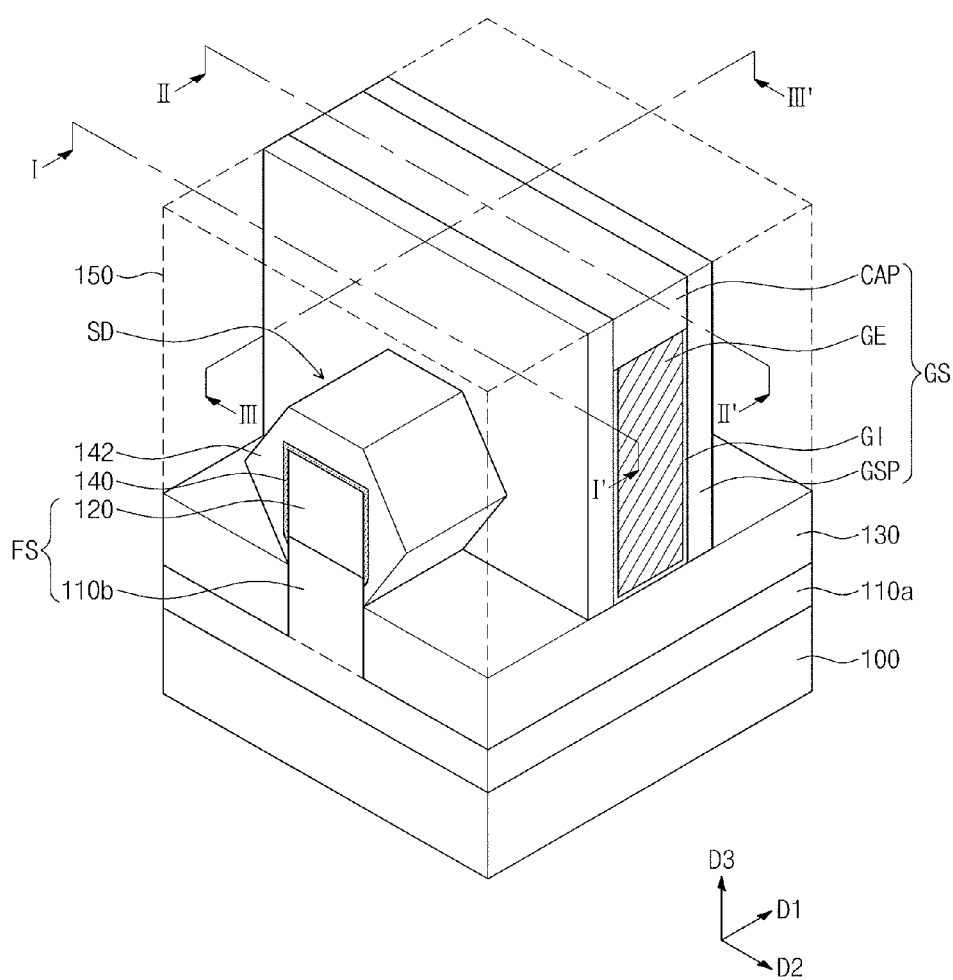
FIG. 1 is a perspective view illustrating a semiconductor device according to example embodiments.

Various example embodiments will now be described more fully hereinafter with reference to the accompanying drawings in which some example embodiments are shown. However, specific structural and functional details disclosed herein are merely representative for purposes of describing example embodiments. Thus, example embodiments may be embodied in many alternate forms and should not be construed as limited to those set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including,"

if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. The regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may, in fact, be executed substantially concurrently or may sometimes be executed in the reverse order, depending upon the functionality/acts involved.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. The two different directions may or may not be orthogonal to each other. The three different directions may include a third direction that may be orthogonal to the two different directions. The plurality of device structures may be integrated in a same electronic device. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure. The plurality of device structures may be arranged in an array and/or in a two-dimensional pattern.

In order to more specifically describe example embodiments, various features will be described in detail with reference to the attached drawings. However, example embodiments described are not limited thereto.

Figure 2:
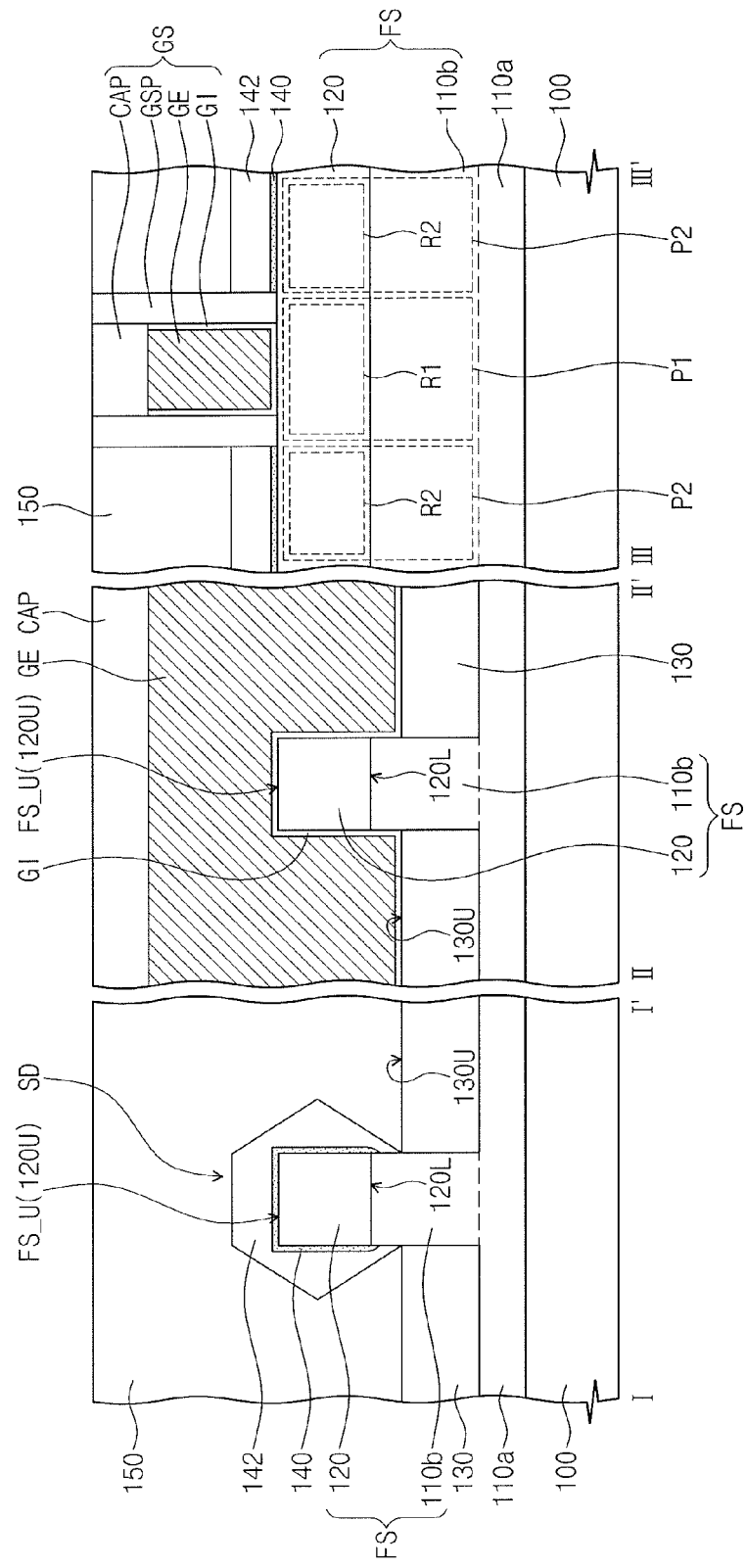
FIG. 2 illustrates cross-sectional views taken along lines I-I', II-II', and III-III' of FIG. 1.

FIG. 1 is a perspective view illustrating a semiconductor device according to example embodiments. FIG. 2 illustrates cross-sectional views taken along lines I-I', II-II', and III-III' of FIG. 1.

Referring to FIGS. 1 and 2, a buffer layer 110a may be provided on a substrate 100. The substrate 100 may include a semiconductor substrate. In some example embodiments, the substrate 100 may be a silicon substrate or a silicon-on-insulator (SOI) substrate. The buffer layer 100a may include a material having a lattice constant different from that of the substrate 100. The lattice constant of the buffer layer 110a may be greater than that of the substrate 100. As an example, the substrate 100 may be a silicon substrate, and the buffer layer 110a may include silicon-germanium (SiGe). The buffer layer 110a may be, e.g., a silicon-germanium layer.

A fin structure FS extending in a first direction D1 may be provided on the buffer layer 110a. In some embodiments, the fin structure FS may be provided on a first region of the substrate 100. The first region may be, e.g., a NMOSFET region. The fin structure FS may protrude from the substrate 100 in a third direction D3 orthogonal to both of the first direction D1 and a second direction D2 crossing the first direction D1. The first and second directions D1, D2 may be directions parallel to a top surface of the substrate 100.

The fin structure FS may include a buffer pattern 110b protruding from the buffer layer 110a in the third direction D3 and an active pattern 120 on the buffer pattern 110b. The buffer pattern 110b may be interposed between the buffer layer 110a and the active pattern 120. The active pattern 120 may extend in the first direction D1. The buffer pattern 110b may include the same material as the buffer layer 110a. A lattice constant of the buffer pattern 110b may be equal to a lattice constant of the buffer layer 110a. The buffer pattern 110b and the buffer layer 110a may be connected to each other and may constitute a unified layer.

The active pattern 120 may have a lattice constant different from that of the buffer pattern 110b. In some embodiments, the lattice constant of the active pattern 120 may be smaller than that of the buffer pattern 110b. Thus, the buffer pattern 110b and the buffer layer 110a may provide a tensile stress to the active pattern 120, i.e., so the active pattern 120 is under tension. As an example, the buffer pattern 110b may include silicon-germanium (SiGe), and the active pattern 120 may include silicon. Isolation layers 130 may be provide at both sides of the fin structure FS. The isolation layers 130 may include, e.g., oxide, nitride, and/or oxinitride. Each of the isolation layers 130 may be provided on the buffer layer 110a and may extend in the first direction D1. The isolation layers 130, which fin structure FS is interposed therebetween, may be spaced apart from each other in the second direction D2.

The isolation layers 130 may expose an upper portion of the fin structure FS. Each of the isolation layers 130 may expose a portion of sidewalls of the fin structure FS. The fin structure FS may have a top surface FS_U and sidewalls exposed by the isolation layers 130. Top surfaces 130U of the isolation layers 130 may be positioned at a lower level than the top surface FS_U of the fin structure FS relative to the top surface of the substrate 100.

At least a portion of the active pattern 120 may be exposed by the isolation layers 130. Each of the isolation layers 130 may expose a portion of sidewalls of the active pattern 120. The active pattern 120 may have a top surface 120U and sidewalls exposed by the isolation layers 130. Top surfaces 130U of the isolation layers 130 may be positioned at a lower level than the top surface 120U of the active pattern 120 relative to the top surface of the substrate 100. In some embodiments, as illustrated in FIG. 2, the top surfaces 130U of the isolation layers 130 may be positioned at a lower level than a bottom surface 120L of the active pattern 120 relative to the top surface of the substrate 100. In other embodiments, the top surfaces 130U of the isolation layers 130 may be positioned at a higher level than the bottom surface 120L of the active pattern 120, from, e.g., relative to, the top surface of the substrate 100.

A gate structure GS crossing over the fin structure FS may be provided on the substrate 100. The gate structure GS may extend in the second direction D2. The gate structure GS may cover a portion of the top surface FS_U and a portion of the sidewalls of the fin structure FS, and may extend to the top surfaces 130U of the isolation layers 130. The gate structure GS may cover a portion of the top surface 120U and a portion of the sidewalls of the active pattern 120. A portion of the active pattern 120 may serve as a channel region of a transistor to be formed on the fin structure FS. The transistor may be an n-type MOS field effect transistor.

The gate structure GS may include a gate electrode GE, a gate insulating pattern GI, and a gate capping pattern CAP. The gate electrode GE may be disposed on the gate insulating pattern GI and may extend in the second direction D2. The gate insulating pattern GI may be disposed between the gate electrode GE and the fin structure FS and between the gate electrode GE and the isolation layers 130 and may extend in the second direction D2. The gate capping pattern CAP may be disposed on a top surface of the gate electrode GE and may extend in the second direction D2. The gate structure GS may also include gate spacers GSP disposed on sidewalls thereof. The gate insulating pattern GI may be interposed between the gate spacers GSP and the gate electrode GE. For example, the gate insulating pattern GI may cover the sidewalls of the gate electrode GE. The gate insulating pattern GI may extend from a bottom surface of the gate electrode GE to sidewalls of the gate electrode GE.

The gate electrode GE may include at least one of a conductive metal nitride, e.g., titanium nitride, tantalum nitride, or tungsten nitride, and metal, e.g., aluminum or tungsten. The gate insulating pattern GI may include a high-k dielectric material. As an example, the gate insulating pattern GI may include at least one of hafnium oxide, hafnium silicate, zirconium oxide, or zirconium silicate. The gate capping pattern GAP and the gate spacers GSP may include nitride, e.g., silicon nitride.

The fin structure FS may include a first part P1 under the gate structure GS and second parts P2 at both sides of the gate structure GS. Top surfaces of the first and second parts PI, P2 may be substantially coplanar. That is, the top surface of the first part P1 and the top surfaces of the second parts P2 may be positioned at a same level from the top surface of the substrate 100. The first part P1 of the fin structure FS may have sidewalls exposed by the isolation layers 130, and the gate structure GS may cover the top surface and the exposed sidewalls of the first part P1 of the fin structure FS. Each of the second parts P2 of the fin structure FS may have sidewalls exposed by the isolation layers 130.

Further, the active pattern 120 may include a first region R1 under the gate structure GS and second regions R2 at the both sides of the gate structure GS. The first region R1 of the active pattern 120 may correspond to an upper portion of the first part P1 of the fin structure FS, and the second regions R2 of the active pattern 120 may correspond to upper portions of the second parts P2 of the fin structure FS. A top surface of the first region R1 of the active pattern 120 may be substantially coplanar with top surfaces of the second regions R2 of the fin structure FS. That is, the top surface of the first region R1 of the active pattern 120 may be positioned at a same level as those of the second regions R2 of the fin structure FS, from the top surface of the substrate 100. The first region R1 of the active pattern 120 may have sidewalls exposed by the isolation layers 130, and the gate structure GS may cover the top surface and the exposed sidewalls of the first region R1 of the active pattern 120. Each of the second regions may have sidewalls exposed by the isolation layer 130.

Source/drain regions SD may be provided at the both sides of the gate structure GS. The source/drain regions SD may be disposed on the second parts P2 of the fin structure FS, respectively. Each of the source/drain regions SD may include at least a portion of each of cladding layers 142. In some embodiments, each of the source/drain regions SD may include at least a portion of each of the cladding layers 142 and a portion of the fin structure FS.

The cladding layers 142 may cover the top surfaces and the exposed sidewalls of the second parts P2 of the fin structure FS, respectively. The cladding layers 142 may be epitaxial layers. Each of the cladding layers 142 may be doped with impurities. For example, each of the cladding layers 142 may include impurities, e.g., arsenic (As) or phosphorus (P). Therefore, the source/drain regions SD may be n-type doped regions.

An interfacial layer 140 may be interposed between each of the cladding layers 142 and the fin structure FS. For example, the interfacial layer 140 may be interposed between each of the cladding layers 142 and the active pattern 120. A pair of the interfacial layers 140 may be disposed on the second regions R2 of the active pattern 120, respectively. The interfacial layer 140 may cover the top surface and the exposed sidewalls of each of the second regions R2 of the active pattern 120. In some embodiments, the interfacial layer 140 may not be disposed between the gate electrode GE and the firs region R1 of the fin structure FS.

In some embodiments, the cladding layers 142 may include a same material as the active pattern 120. The cladding layers 142 and the active pattern 120 may include a first element. The first element may be, e.g., silicon (Si). As an example, the active pattern 120 may include, e.g., consist essentially of, silicon, and the cladding layers 142 may include, e.g., consist essentially of, silicon (Si) and/or silicon carbide (SiC). The interfacial layer 140 may include an element, different from the first element which constitutes each of the active pattern 120 and the cladding layers 142. The interfacial layer 140, the buffer layer 110a, and the buffer pattern 110b may include a same element. For example, the interfacial layer 140, the buffer layer 110a, and the buffer pattern 110b may include, e.g., consist essentially of, a second element different from the first element, e.g., the second element may be germanium (Ge). In some embodiments, the interfacial layer 140, the buffer layer 110a, and the buffer pattern 110b may include silicon-germanium (SiGe), and the interfacial layer 140 may include germanium (Ge). The interfacial layer 140 may have a thickness in a range of, e.g., about 2 Å to about 2 nm.

A lower insulating layer 150 may be provided on the substrate 100 to cover the source/drain regions SD, e.g., to cover the cladding layers 142, and at least the sidewalls of the gate structure GS. The lower insulating layer 150 may include at least one of, e.g., silicon oxide, silicon nitride, silicon oxinitride, and lower-k dielectric material. The lower insulating layer 150 may cover a portion of the isolation layers 130 uncovered by the gate structure GS.

In some embodiments, an upper insulating layer may be provided on the substrate 100 including the gate structure GS disposed thereon. The upper insulating layer may be at least one of, e.g., silicon oxide, silicon nitride, and silicon oxinitride. A first contact plug electrically connected to the source/drain regions SD and a second contact plug electrically connected to the gate electrode GE may be provided through the upper insulating layer and the lower insulating layer 150. Interconnection wiring layers may be disposed on the upper insulating layer to be in contact with the first and second contact plugs. The interconnection wiring layers may be configured to apply voltages to the source/drain regions SD and the gate electrode GE via the first and second contact plugs, respectively. The interconnection wiring layers and the first and second contact plugs may include a conductive material.

According to the present embodiments, the fin structure FS may include the buffer pattern 110b and the active pattern 120. A lattice constant of the active pattern 120 may be smaller than that of the buffer pattern 110b. Thus, the buffer pattern 110b may provide the tensile stress to the active pattern 120. A portion of the active pattern 120 may serve as the channel region of the transistor formed on the fin structure FS. In the case where the transistor is an n-type MOS field effect transistor, due to the tensile stress provided, e.g., applied, to the active pattern 120 by the buffer pattern 110b, the channel characteristics of the n-type MOS field effect transistor, e.g., carrier mobility, may be improved.

Further, the fin structure FS may include the first part P1 under the gate structure GS and the second parts P2 at both sides of the gate structure GS. The top surface of the first part P1 may be substantially coplanar with the top surfaces of the second parts P2. The cladding layers 142 may be the epitaxial layers that are uniformly grown using the second parts P2 as seeds with the interfacial layer 140 therebetween. As a result, because the cladding layers 142 may be uniformly grown on the fin structure FS, it is possible that a semiconductor device having a highly improved reliability may be embodied.

FIGS. 3, 5, 7, and 9 are perspective views illustrating stages in a method for manufacturing a semiconductor device according to example embodiments. FIGS. 4, 6, 8, and 10 illustrate cross-sectional views taken along lines I-I', II-II', and III-III' of FIGS. 3, 5, 7, and 9, respectively.

Figure 3:
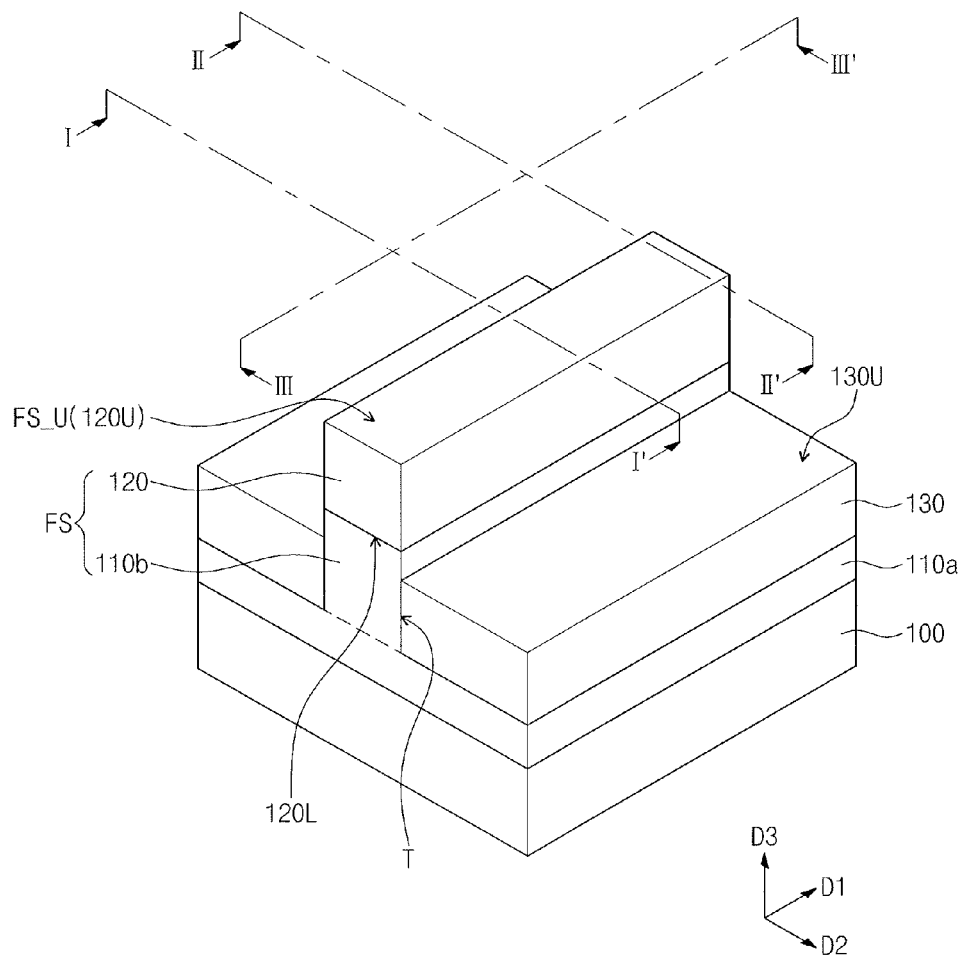
FIGS. 3, 5, 7, and 9 are perspective views illustrating stages in a method of manufacturing a semiconductor device according to example embodiments.
Figure 4:
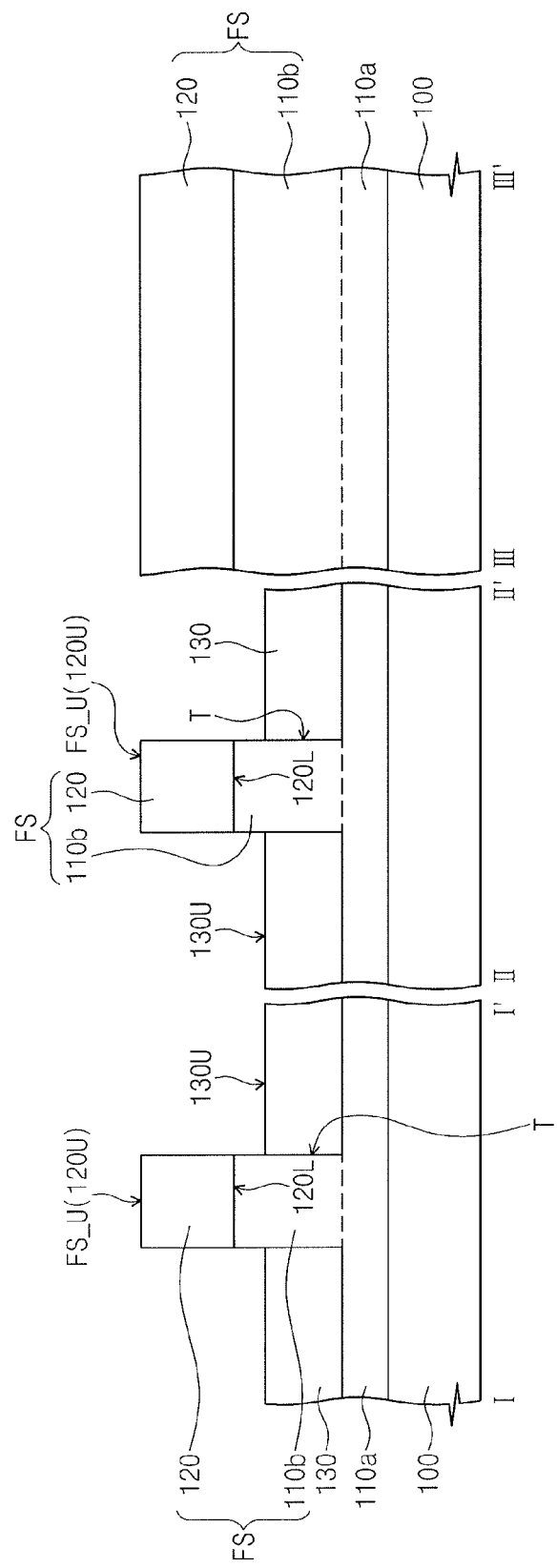
FIGS. 4, 6, 8, and 10 illustrate cross-sectional views taken along lines I-I', II-II', and III-III' of FIGS. 3, 5, 7, and 9, respectively.

Referring to FIGS. 3 and 4, the buffer layer 110a may be formed on the substrate 100. The fin structure FS may be formed on the buffer layer 110a and may extend in the first direction D1. The fin structure FS may include the buffer pattern 110b protruding upwardly from the buffer layer 110a and extending in the first direction D1 and the active pattern 120 disposed on the buffer pattern 110b and extending in the first direction D1. The formation of the fin structure FS may include forming a preliminary buffer layer and an active layer sequentially stacked on the substrate 100, and forming trenches T defining the fin structure FS by patterning the active layer and the preliminary buffer layer.

The preliminary buffer layer may have a lattice constant different from that of the substrate 100. The preliminary buffer layer may include a material having a lattice constant greater than that of the substrate 100. As an example, the substrate 100 may be a silicon substrate, and the preliminary buffer layer may include silicon-germanium (SiGe). In some embodiments, the preliminary buffer layer may be formed by a selective epitaxial growth (SEG) process using the substrate 100 as a seed. In other embodiments, the preliminary buffer layer may be formed by a chemical vapor deposition (CVD) process or a molecular beam epitaxy (MBE) process.

The active layer may have a lattice constant different from that of the preliminary buffer layer. The active layer may include material having a lattice constant smaller than that of the preliminary buffer layer. As an example, the preliminary buffer layer may include silicon-germanium (SiGe), and the active pattern may include silicon (Si). Thus, the preliminary buffer layer may provide a tensile stress to the active layer. In some embodiments, the active layer may be formed by a selective epitaxial growth (SEG) process using the preliminary buffer layer as a seed. In other embodiments, the active layer may be formed by a chemical vapor deposition (CVD) process or a molecular beam epitaxy (MBE) process.

The formation of the trenches T may include forming a mask pattern on the active layer to define a region for forming the fin structure FS, and anisotropically etching the active layer and the preliminary buffer layer using the mask pattern as an etching mask. As a result, during the etching process, the active pattern 120 may be formed by etching the active layer, and the buffer pattern 110b may be formed by etching a portion of the preliminary buffer layer. A lower portion of the preliminary buffer layer, which is not etched during the etching process, may be defined as the buffer layer 110a.

Isolation layers 130 may be formed at both sides of the fin structure FS. The isolation layers 130 may be formed to fill the trenches T. The formation of the isolation layers 130 may include forming an insulating layer filling the trenches T and planarizing the insulating layer until the mask pattern is exposed.

An upper portion of the fin structure FS may be exposed by recessing upper portions of the isolation layers 130. The top surfaces 130U of the isolation layers 130 may be positioned at a lower level than the top surface 120U of the active pattern 120, from, e.g., relative to, the top surface of the substrate 100. In some embodiments, as shown in FIG. 4, the top surfaces 130U of the isolation layers 130 may be positioned at a lower level than the bottom surface 120L of the active pattern 120, from the top surface of the substrate 100. In other embodiments, the top surfaces 130U of the isolation layers 130 may be positioned at a higher level than the bottom surface 120L of the active pattern 120, from the top surface of the substrate 100. The process of recessing the upper portions of the isolation layers 130 may be performed using an etching condition capable of providing an etching selectivity with respect to the fin structure FS. The process of recessing the upper portions of the isolation layers 130 may be performed using, for example, a wet etching process. The mask pattern may be removed during the process of recessing the upper portions of the isolation layers 130, or after the upper portions of the isolation layers 130 are recessed.

Figure 5:
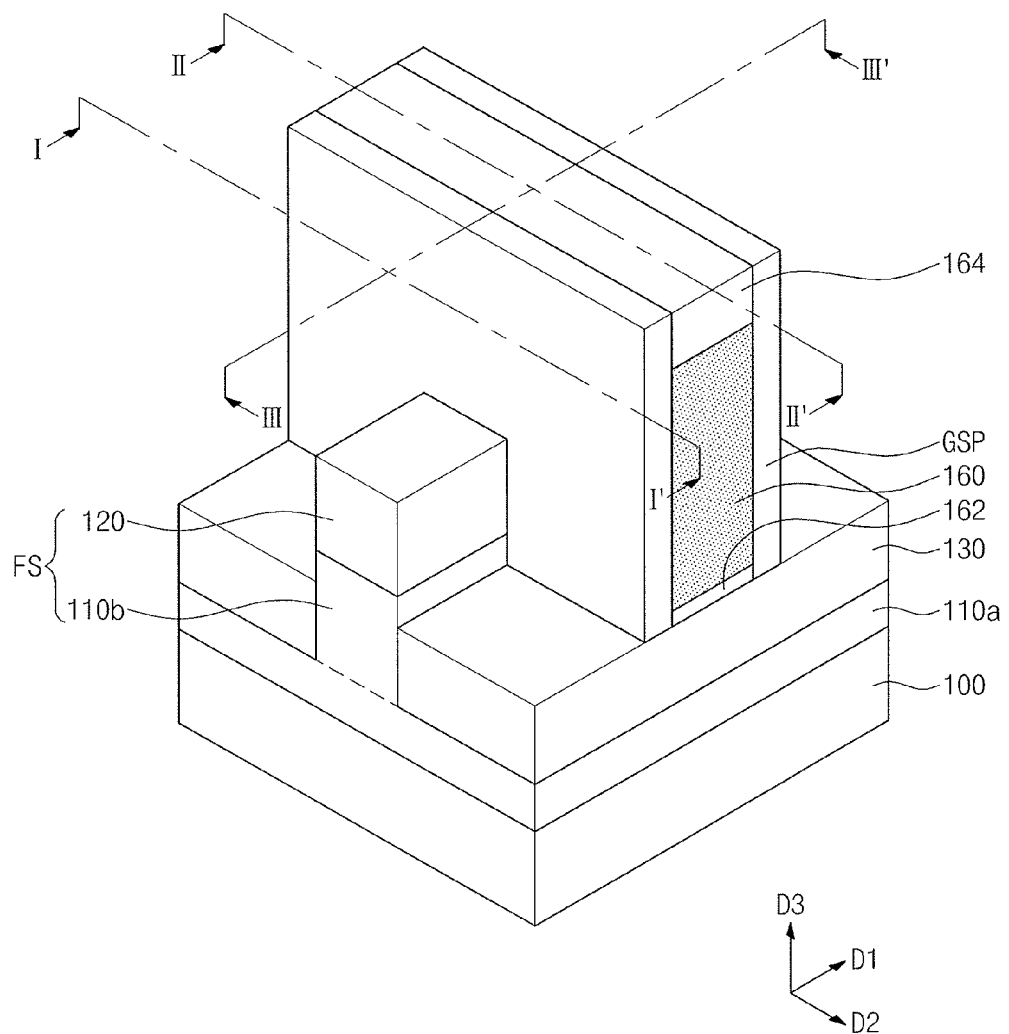
Figure 6:
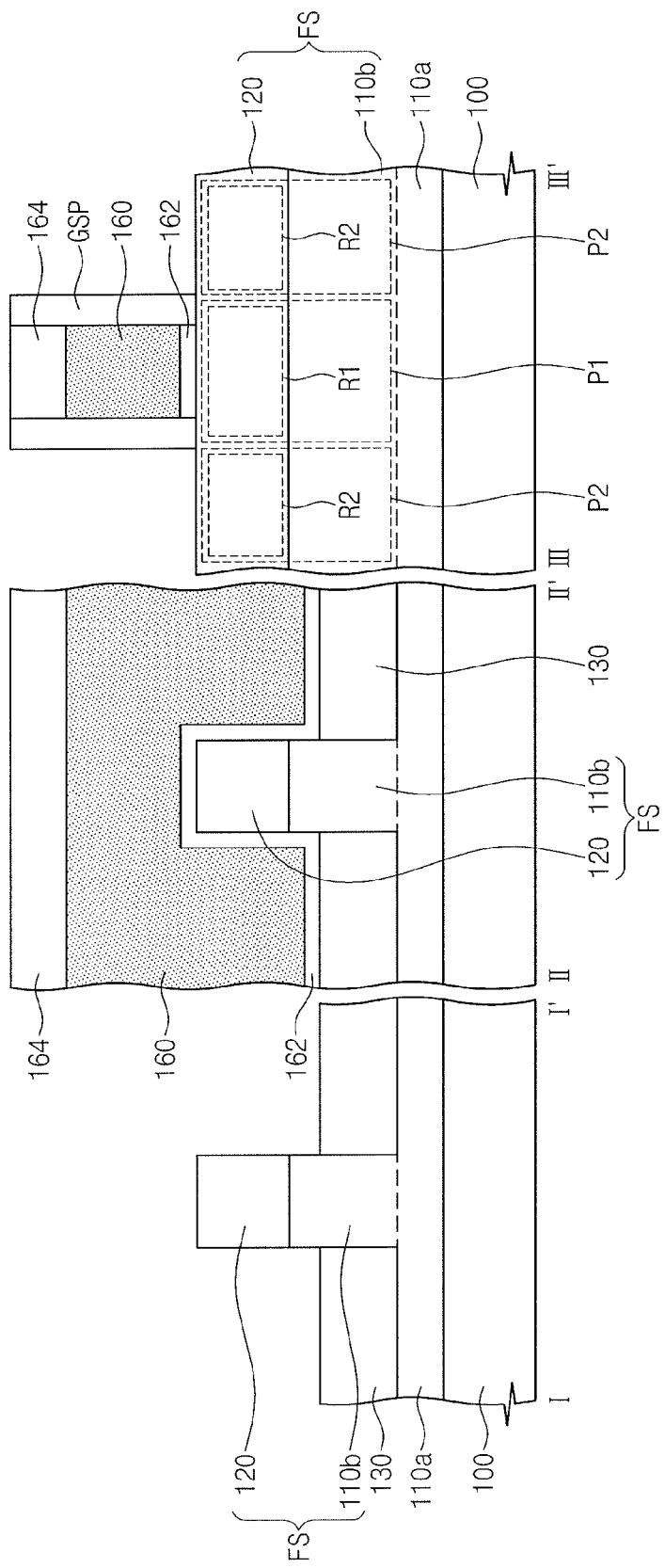

Referring to FIGS. 5 and 6, an etch stop layer and a sacrificial gate layer may be sequentially formed on the substrate 100 to cover the fin structure FS and the isolation layers 130. The etch stop layer may include, e.g., an oxide layer. The sacrificial gate layer may be formed of a material having an etching selectivity with respect to the etch stop layer. The sacrificial gate layer may be formed of, e.g., polysilicon.

The sacrificial gate pattern 160 may be formed by patterning the sacrificial gate layer. The sacrificial gate pattern 160 may be formed to cross over the fin structure FS. The formation of the sacrificial gate pattern 160 may include forming a gate mask pattern 164 on the sacrificial gate layer and etching the sacrificial gate layer using the gate mask pattern 164 as an etching mask. The gate mask pattern 164 may be formed of, e.g., silicon nitride. The process of etching the sacrificial gate layer may be performed using an etching process having an etching selectivity with respect to the etch stop layer.

After the sacrificial gate pattern 160 is formed, the etch stop pattern 162 may be formed by removing the etch stop layer at both sides of the sacrificial gate pattern 160. The etch stop pattern 162 may extend along the bottom surface of the sacrificial gate pattern 160 and may cover a top surface and sidewalls of the fin structure FS and the top surfaces of the isolation layers 130.

As the sacrificial gate pattern 160 may be formed to cross over the fin structure FS, the first part P1 and second parts P2 may be defined in the fin structure FS. The first part P1 of the fin structure FS may be positioned under the sacrificial gate pattern 160 and may be vertically overlapped with the sacrificial gate pattern 160. The second parts P2 of the fin structure FS may be positioned at both sides of the sacrificial gate pattern 160 and may be horizontally separated from each other by the first part P1. The top surface of the first part P1 may be substantially coplanar with the top surfaces of the second parts P2.

Further, as the sacrificial gate pattern 160 is formed to cross over the fin structure FS, the first region R1 and the second regions R2 may be defined in the active pattern 120. The first region R1 of the active pattern 120 may be positioned under the sacrificial gate pattern 160 and may be vertically overlapped with the sacrificial gate pattern 160. The second regions R2 of the active pattern 120 may be positioned at the both sides of the sacrificial gate pattern 160 and may be horizontally separated from each other by the first region R1. The first region R1 of the active pattern 120 may correspond to an upper portion of the first part P1 of the fin structure FS. The second regions R2 of the active pattern 120 may correspond to upper portions of the second parts of the fin structure FS, respectively. The top surface of the first region R1 may be substantially coplanar with top surfaces of the second regions R2.

Gate spacers GSP may be formed on both sidewalls of the sacrificial gate pattern 160. The gate spacers GSP may include, e.g., silicon nitride. The formation of the gate spacers GSP may include forming a gate spacer layer on the substrate on which the sacrificial gate pattern 160 is formed, and anisotropically etching the gate spacer layer. The top surfaces of the second part P2 of the fin structure FS and the top surfaces of the isolation layers 130 at the both sides of the sacrificial gate pattern 160 may be exposed by etching the gate spacer layer. A portion of the gate mask pattern 164 may be further etched during etching the gate spacer layer. However, a remaining portion of the gate mask pattern 164 may be left on the sacrificial gate pattern 160 after the gate spacers GSP are formed.

Figure 7:
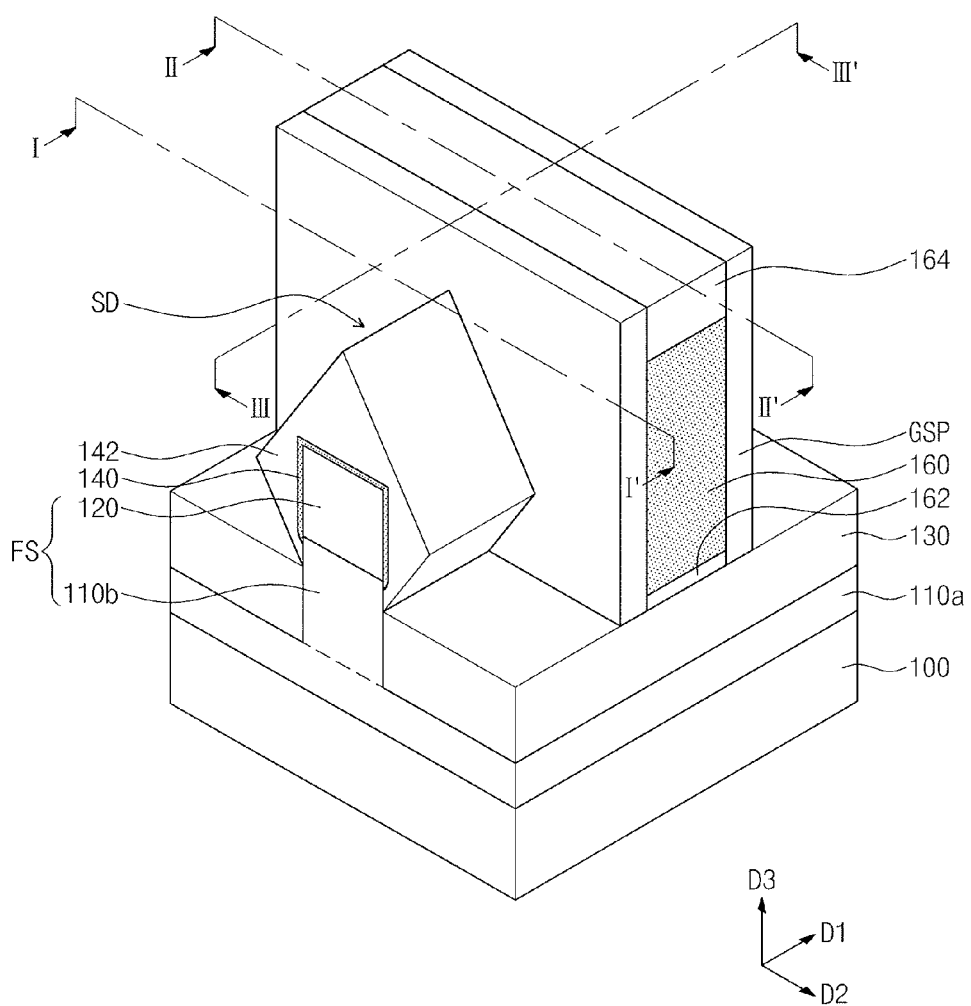
Figure 8:
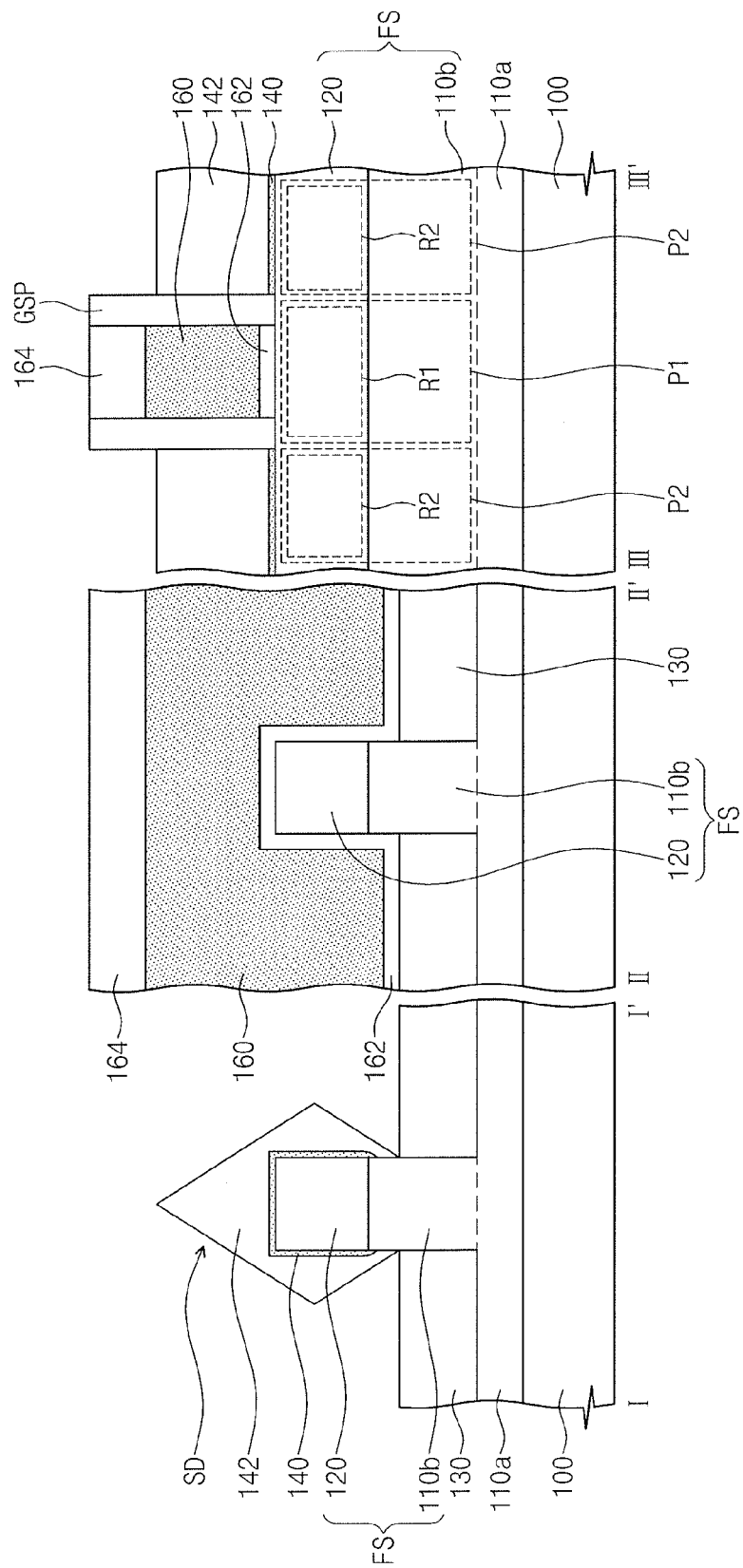

Referring to FIGS. 7 and 8, the cladding layers 142 may be formed at both, e.g., opposite, sides of the sacrificial gate pattern 160. The cladding layers 142 may be formed on the second parts P2 of the fin structure FS, respectively. Each of the cladding layers 142 may cover the top surface and the sidewalls of each of the second part P2 of the fin structure FS. That is, each of the cladding layers 142 may cover the top surface and the sidewalls of each of the second regions R2 of the active pattern 120.

The formation of the cladding layers 142 may include performing a selective epitaxial growth (SEG) process using the fin structure FS exposed by the isolation layers 130 as a seed. In some embodiments, the cladding layers 142 may include a same element as that of the active pattern 120. The active pattern 120 and the cladding layers 142 may include a first element, e.g., silicon (Si). As an example, the active pattern 120 may include silicon (Si), and the cladding layers 142 may include silicon (Si) and/or silicon carbide (SiC).

The interfacial layer 140 may be formed between each of the cladding layers 142 and the fin structure FS. The interfacial layer 140 may be interposed between each of the cladding layers 142 and the active pattern 120. A pair of the interfacial layers 140 may be formed on the second regions R2 of the active patterns 120, respectively. The interfacial layer 140 may cover the top surface and sidewalls of each of the second region R2 of the active pattern 120. In some embodiments, the interfacial layer 140 may include an element different from that of each of the active pattern 120 and the cladding layers 142. The interfacial layer 140 may include a same element as that of each of the buffer layer 110a and the buffer pattern 110b. The interfacial layer 140, the buffer layer 110a, and the buffer pattern 110b may include a second element different from the first element. The second element may be, e.g., germanium (Ge). In some embodiments, the buffer layer 110a and the buffer pattern 110b may include silicon-germanium (SiGe), and the interfacial layer 140 may include germanium (Ge).

The interfacial layer 140 may be formed by a preconditioning process performed before the cladding layers 142 are formed or while the cladding layers 142 are formed. As an example, the top surface and the sidewalls of the second parts P2 of the fin structure FS may be exposed by the anisotropic etching process for forming the gate spacers GSP. A native oxide may be formed on the exposed surfaces of the fin structure FS. The preconditioning process may be performed to remove the native oxide before the cladding layers 142 are formed or while the cladding layers 142 are formed. The preconditioning process may include a thermal treatment process or a plasma treatment process using, e.g., hydrogen, etc. The thermal treatment process or the plasma treatment process may be performed at a temperature of about 500° C. or more, e.g., about 500° C. to about 1500° C.

In detail, during the preconditioning process, the second element, e.g., germanium (Ge), contained in the buffer pattern 110b and the buffer layer 110a may be diffused along the surfaces of the second regions R2 of the active pattern 120 during the thermal or plasma treatment processes, and may be redeposited or accumulated on the surfaces of the second regions R2 to define the interfacial layer 140. Thus, the interfacial layer 140 may be formed on each of the second regions R2 of the active pattern 120. As a result, the interfacial layer 140 may be formed between each of the cladding layers 142 and each of the second regions R2 of the active pattern 120, e.g., so the resultant epitaxial growth of the cladding layers 142 may have improved uniformity. The interfacial layer 140 may have a thickness in a range of, e.g., about 2 Å to about 2 nm. In some embodiments, the interfacial layer 140 may not be formed on the first region R1 of the active pattern 120 under the sacrificial gate pattern 160.

The source/drain regions SD may be formed by doping the cladding layers 142 with impurities. As an example, during the selective epitaxial growth of the cladding layers 142, the cladding layers 142 may be concurrently doped with n-type impurities, e.g., arsenic (As) or phosphorous (P). As another example, the cladding layers 142 may be doped with n-type impurities, e.g., arsenic (As) or phosphorous (P), after the cladding layers 142 are formed by the selective epitaxial growth process. In some embodiments, a portion of the fin structure FS may be doped during the doping process for the cladding layers 142. Accordingly, each of the source/drain regions SD may be formed in at least a portion of each of the cladding layers 142 or in at least a portion of each of the cladding layers and a portion of the fin structures FS. That is, each of the source/drain regions SD may include at least a portion of each of the cladding layers 142 or at least a portion of each of the cladding layers and a portion of the fin structures FS. As a result, the source/drain regions SD may be provided at both sides of the sacrificial gate pattern 160. The source/drain regions SD may be provided on the second parts P2 of the fin structure FS.

Figure 9:
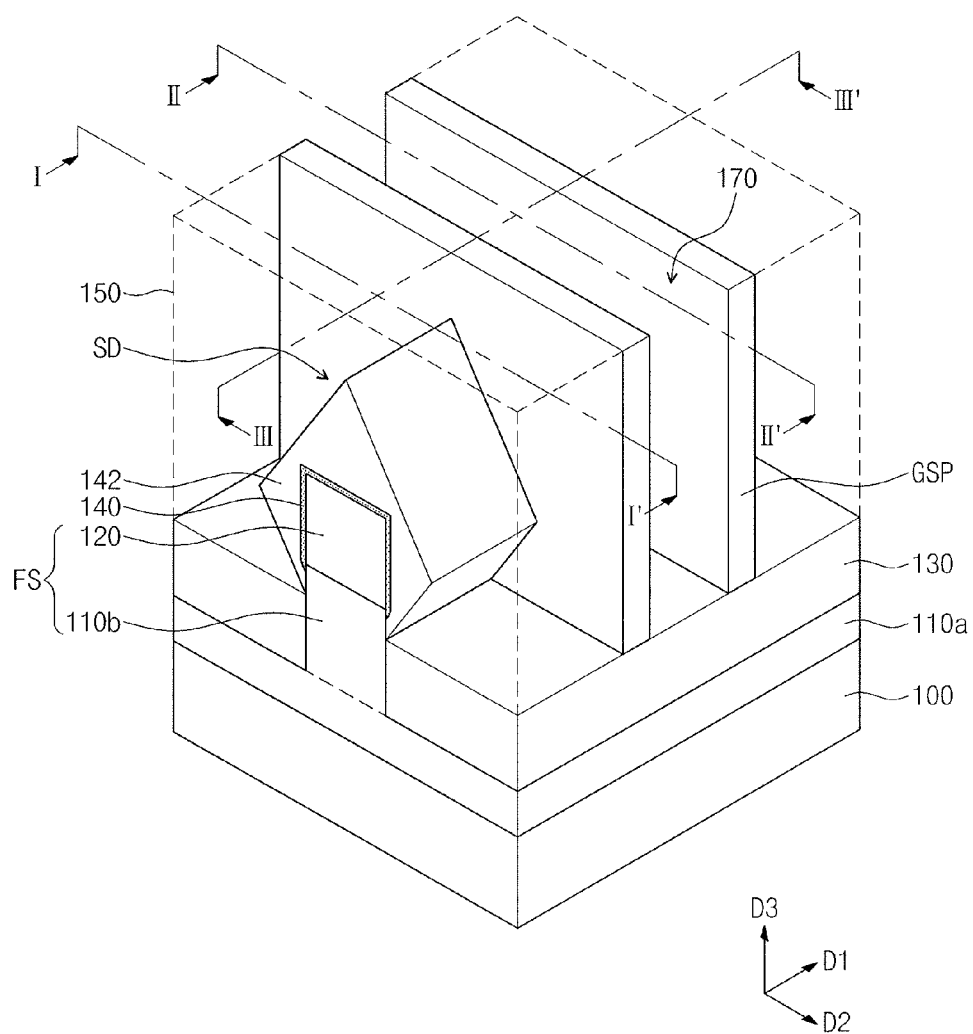
Figure 10:
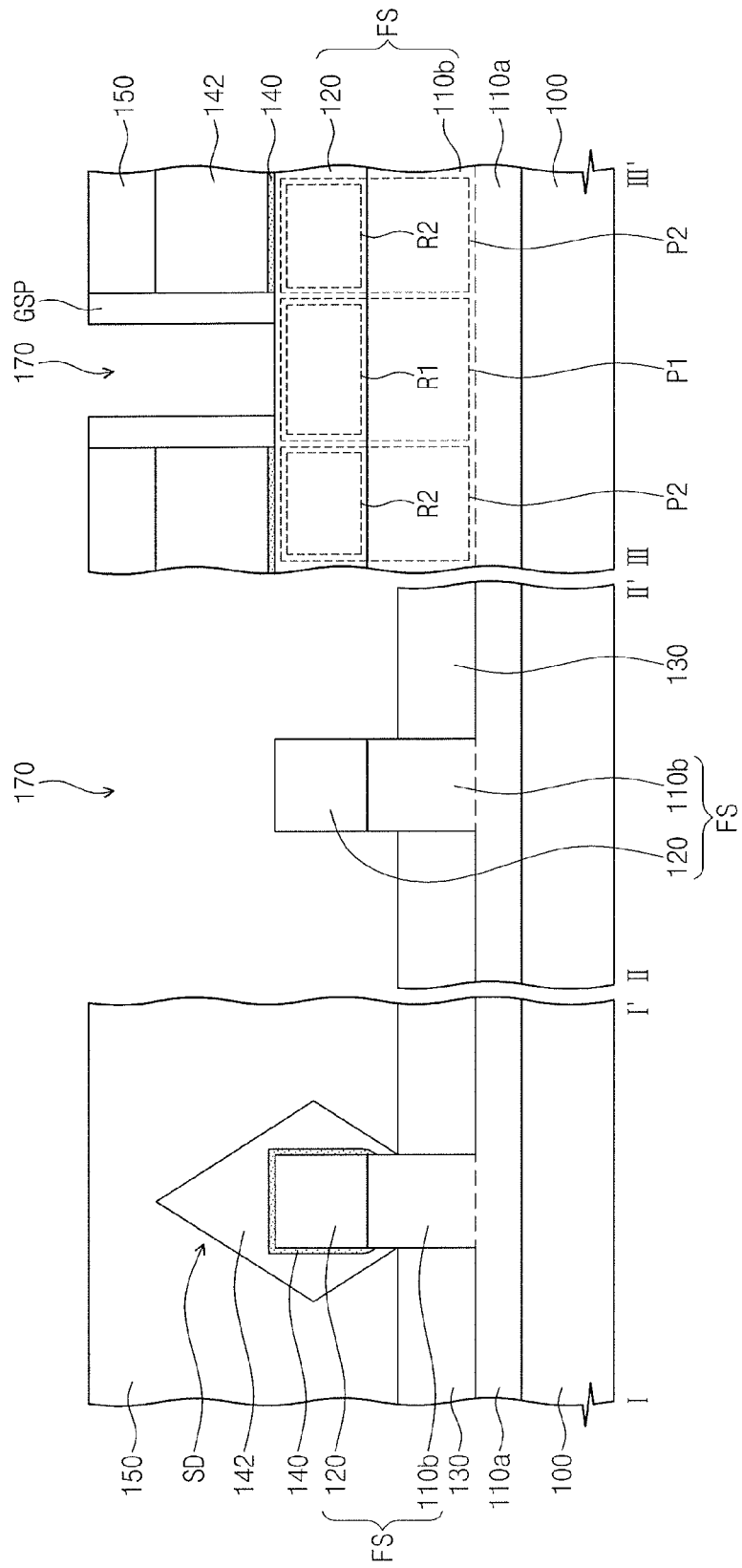

Referring to FIGS. 9 and 10, the lower insulating layer 150 may be formed on the substrate 100 on which the source/drain regions SD are formed. The lower insulating layer 150 may be formed to cover the source/drain region SD and at least sidewalls of the gate spacers GSP. The lower insulating layer 150 may cover the cladding layers 142. The low insulating layer 150 may include at least one of, e.g., silicon oxide, silicon nitride, silicon oxynitride, and low-k dielectric material.

A gap region 170 may be formed between the gate spacers GSP by removing the gate mask pattern 164, the sacrificial gate pattern 160, and the etch stop pattern 162. The gap region 170 may expose the first part P1 of the fin structure FS. While the gate mask pattern 164 is removed, a portion of the lower insulating layer 150 may be removed. The formation of the gap region 170 may include etching the sacrificial gate pattern 160 using an etching condition having an etch selectivity with respect to the gate spacers GSP, the lower insulating layer 170, and the etch stop pattern 162. Further, the formation of the gap region 170 may include exposing the first part P1 of the fin structure FS by removing the etch stop pattern 162.

Referring back to FIGS. 1 and 2, the gate insulating pattern GI and the gate electrode GE may be formed to fill the gap region 170. For example, a gate insulating layer may be formed in the gap region 170, and on the lower insulating layer and the gate spacers GSP. The gate insulating layer may be formed to cover the first part P1 of the fin structure FS. The gate insulating layer may include a high-k dielectric material. For example, the gate insulating layer may include at least one of hafnium oxide, hafnium silicate, zirconium oxide, and zirconium silicate, but not limited thereto. The gate insulating layer may be formed using, e.g., an atomic layer deposition (ALD) process or a chemical vapor deposition (CVD) process. A gate layer may be formed on the gate insulating layer to fill the gap region 170. The gate layer may include at least one of a conductive metal nitride, e.g., titanium nitride, tantalum nitride, or tungsten nitride, and a metal, e.g., aluminum or tungsten. The gate insulating pattern GI and the gate electrode GE may be formed by planarizing the gate layer and the gate insulating layer which are sequentially stacked. Upper surfaces of the lower insulating layer 150 and the gate spacers GSP may be exposed by the planarization process. The gate insulating pattern GI may extend along a bottom surface of the gate electrode GE and may extend to both sidewalls of the gate electrode GE. The gate insulating pattern GI may be interposed between the gate electrode GE and the gate spacers GSP.

Upper portions of the gate electrode GE and gate insulating pattern 170 may be removed. Thus, a recess region may be defined in the gap region 170. The gate capping pattern CAP may be formed in the recess region. The formation of the capping pattern CAP may include forming a capping layer on the lower insulating layer 150 to fill the recess region, and planarizing the capping layer until the lower insulating layer 150 is exposed. The capping pattern CAP may include, e.g., silicon nitride.

The gate structure GS including the gate insulating pattern GI, the gate electrode GE, gate capping pattern CAP, and the gate spacers GSP may be defined. The gate structure GSP may extend in the second direction D2.

In some embodiments, an upper insulating layer may be formed on the substrate 100 including the gate structure GS formed thereon. The upper insulating layer may include at least one of, e.g., silicon oxide, silicon nitride, and silicon oxynitride. First contact holes may be formed through the upper insulating layer and the lower insulating layer 150 to expose the source/drain regions SD. The first contact holes may be formed by etching the upper insulating layer and the lower insulating layer 150. When the upper insulating layer and the lower insulating layer 150 are etched, an upper portion of each of an upper portion of each of the cladding layers 142, e.g., an upper portion of each of the source/drains SD, may be partially removed, and thus, each of the cladding layers 142 may have a shape shown in FIG. 1.

A second contact hole exposing the gate electrode GE may be formed through the upper insulating layer and the lower insulating layer 150. Next, the first contact plug filling the first contact plug and a second contact plug filling the second contact plug may be formed. Interconnection wiring layers may be formed on the upper insulating layer to be in contact with the first and second contact plugs. The interconnection wiring layers may be configured to apply voltages to the source/drain regions SD and the gate electrode GE via the first and second contact plugs, respectively. The interconnection wiring layers and the first and second contact plugs may include a conductive material.

Figure 11:
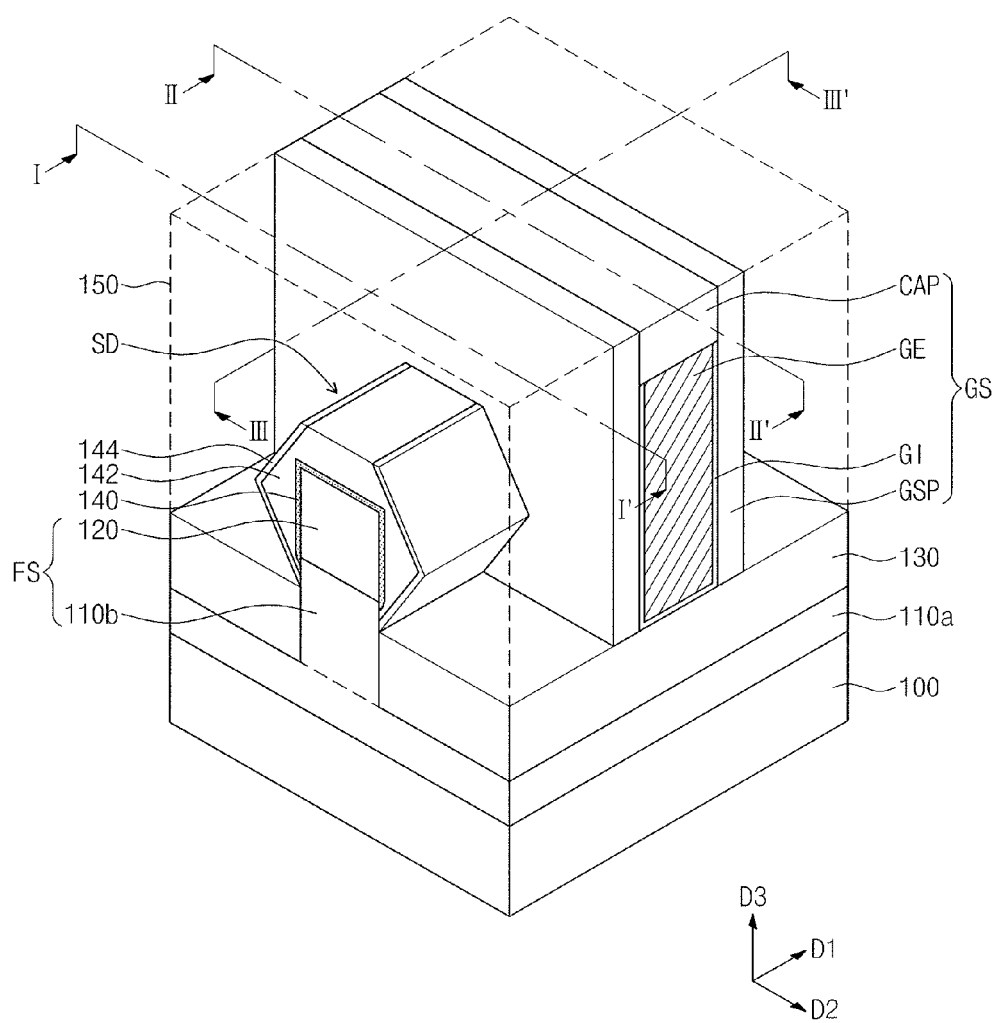
FIG. 11 is a perspective view illustrating a semiconductor device according to example embodiments.
Figure 12:
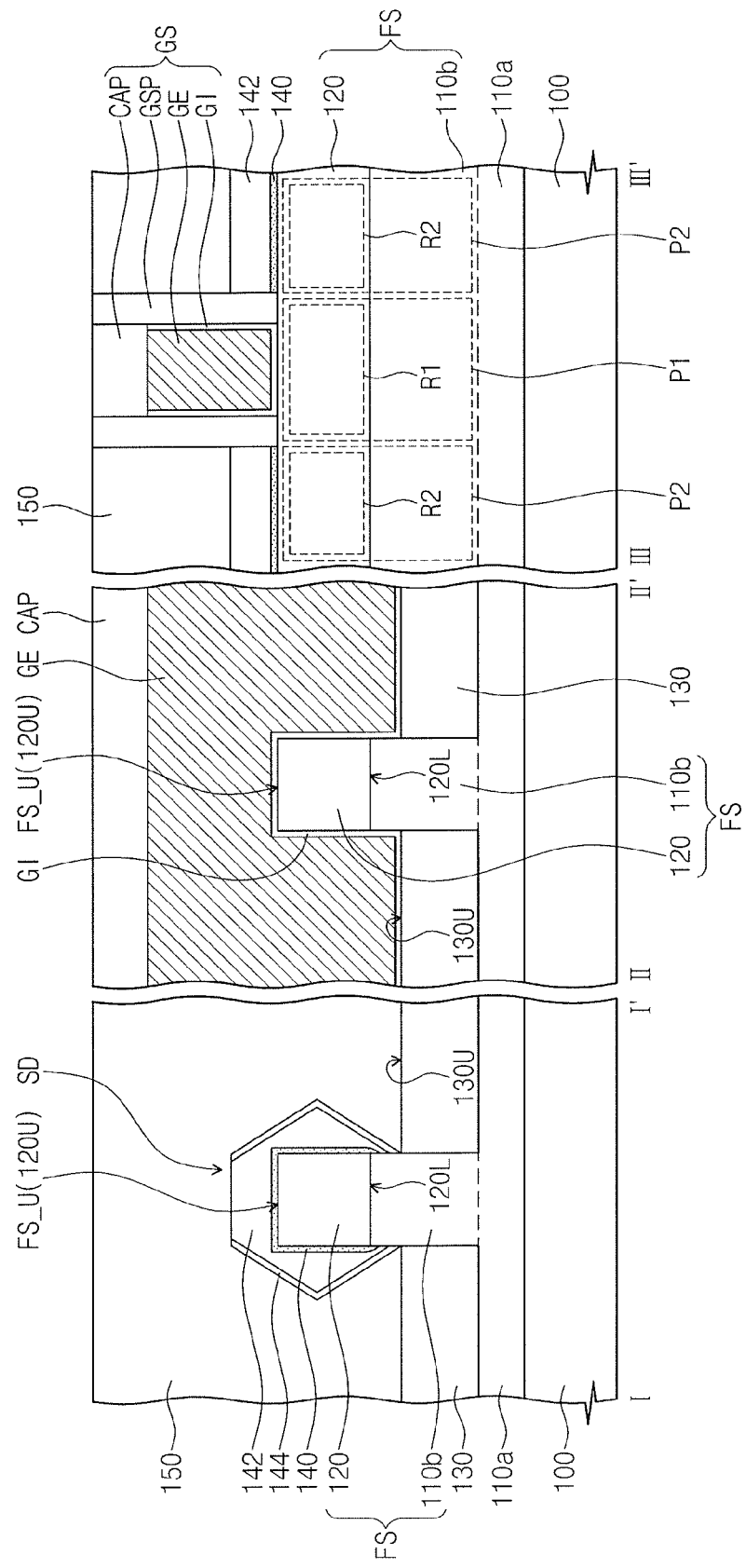
FIG. 12 illustrates cross-sectional views taken along lines I-I', II-II', and III-III' of FIG. 11.

FIG. 11 is a perspective view illustrating a semiconductor device according to example embodiments. FIG. 12 illustrates cross-sectional views taken along lines I-I', II-II', and III-III' of FIG. 11. Hereinafter, descriptions of the same elements as described in the embodiments illustrated in FIGS. 1 and 2 will be omitted or mentioned briefly for the purpose of ease and convenience in explanation.

Referring to FIGS. 11 and 12, the buffer layer 110a may be provided on the substrate 100. The buffer layer 110a may have a lattice constant different from that of the substrate 100. The buffer layer 110a may include material having a lattice constant greater than that of the substrate 100. As an example, the substrate 100 may include a silicon substrate, and the buffer layer 110a may include silicon-germanium (SiGe). The fin structure FS extending in the first direction D1 may be provided on the buffer layer 110a. In the present embodiments, the fin structure FS may be provided on a second region of substrate 100 different from the first region of the substrate 100 described with reference to FIGS. 1 and 2. As an example, the second region may be a PMOSFET region. The fin structure FS may include the buffer pattern 110b and the active pattern 120. The buffer pattern 110b may protrude in the third direction from the buffer layer 110a and may extend in the first direction D1. The active pattern 120 may be disposed on the buffer pattern 110b and may extend in the first direction D1.

The buffer pattern 110b may include a same material as that of the buffer layer 110a. A lattice constant of the buffer pattern 110b may be equal to that of the buffer layer 110a. The buffer pattern 110b and the buffer layer 110a may be connected with each other and may constitute a unified layer.

The active pattern 120 may include an element having a lattice constant different from that of the buffer pattern 110b. In the present embodiments, the lattice constant of the active pattern 120 may be greater than that of the buffer pattern 110b. Thus, the buffer pattern 110b and the buffer layer 110a may provide a compressive stress to the active pattern 120. The active pattern 120 and the buffer pattern 110b may include a same material. The active pattern 120 and the buffer pattern 110b may include a third element. The third element content of the active pattern 120 may be higher than that of the buffer pattern 110b. As an example, the active pattern 120 and the buffer pattern 110b may include silicon-germanium (SiGe), e.g., the third element may be germanium (Ge). For example, the buffer pattern 110b may include silicon-germanium having germanium content of about 20 atomic percent (at. %) based on total silicon-germanium content in the buffer pattern 110b, and the active pattern 120 may include a silicon-germanium having germanium content of about 40 atomic percent (at. %) based on total silicon-germanium content in the active pattern 120.

The isolation layers 130 may be provided at both sides of the fin structure FS. The isolation layers 130 may be disposed on the buffer layer 110a and extend in the first direction D1. The isolation layers 130, which the fin structure FS is interposed therebetween, may be spaced apart from each other in the second direction D2.

The isolation layers 130 may expose the upper portion of the fin structure FS, and thus the fin structure FS may have the exposed top surface FS_U and sidewalls. The isolation layers 130 may have top surfaces 130U positioned at a lower level than the top surface FS_U of the fin structure FS, from a top surface of the substrate 100. In some embodiments, as shown in FIG. 12, the upper surfaces 130U of the isolation layers 130 may be positioned at a lower level than a bottom surface 120L of the active pattern 120, from the top surface of the substrate 100. In other embodiments, the upper surfaces 130U of the isolation layers 130 may be positioned at a higher level than a bottom surface 120L of the active pattern 120, from the top surface of the substrate 100.

The gate structure GS may be provided on the substrate 100 to cross over the fin structure FS. The gate structure GS may extend in the second direction D2. The gate structure GS may cover the top surface FS_U and the sidewalls of the fin structure FS and the top surfaces 130U of the isolation layers 130. The gate structure GS may also cover the top surface 120U and the sidewalls of the active pattern 120. The active pattern 120 may serve as a channel region of a transistor including the gate structure GS formed on the fin structure FS. In this case, the transistor may be a p-type MOS field effect transistor.

The gate structure GS may include the gate electrode GE, gate insulating pattern GI, and the gate capping pattern CAP. The gate electrode pattern GE may be disposed on the gate insulating pattern GI and may extend in the second direction D2. The gate insulating pattern GI may be disposed between the gate electrode GE and the fin structure FS and between the gate electrode GE and the isolation layers 130 and may extend in the second direction D2. The gate insulating pattern GI may be interposed between the gate spacers GSP and the gate electrode GE. The gate capping pattern CAP may be disposed on the gate electrode GE and may extend in the second direction D2.

The fin structure FS may include the first part P1 under the gate structure GS and the second parts P2 at both sides of the gate structure GS. The top surface of the first part P1 of the fin structure FS may be substantially coplanar with the top surfaces of the second parts P2 of the fin structure FS. The first part P1 of the fin structure FS may have sidewalls exposed by the isolation layers 130. The gate structure GS may cover the top surface and the sidewalls of the first part P1 of the fin structure FS. Each of the second parts P2 of the fin structure FS may have sidewalls exposed by the isolation layers 130 and gate structure GS.

Further, the active pattern 120 may include the first region R1 under the gate structure GS and the second regions R2 at the both sides of the gate structure GS. The first region R1 of the active pattern 120 may correspond to an upper portion of the first part P1 of the fin structure FS, and the second regions R2 of the active pattern 120 may correspond to upper portions of the second parts P2 of the fin structure FS. The top surface of the first region R1 of the active pattern 120 may be substantially coplanar with top surfaces of the second regions R2 of the active pattern 120. The first region R2 may have sidewalls exposed by the isolation layers 130. The gate structure GS may cover the top surface and the sidewalls of the first region R1 of the active pattern 120. The second regions R2 of the active pattern 120 may have sidewalls exposed by isolation layers 130 and the gate structure 130.

The Source/drain regions SD may be disposed at both sides of the gate structure GS. The source/drain regions SD may be disposed on the second ports P2 of the fin structure FS, respectively. Each of the source/drain regions may SD include at least a portion of each of cladding layers 142. In some embodiments, each of the source/drain regions may SD include at least a portion of each of cladding layers 142 and at least a portion of each of capping layers 144. In other embodiments, each of the source/drain regions may SD include at least a portion of each of cladding layers 142 and at least a portion of each of the capping layers 144 and a portion of the fin structure FS.

Each of the cladding layers 142 may cover the top surface and the sidewalls of each of the second part P2 of the fin structure FS. The cladding layers 142 may be epitaxial layers grown from the fin structure FS. The cladding layers 142 may respectively include impurities. For example, the cladding layers 142 may be doped with boron (B). Thus, the source/drain regions SD may be p-type doped regions.

An interfacial layer 140 may be interposed between each of the cladding layers 142 and the fin structure FS. The interfacial layer 140 may be interposed between each of the cladding layers 142 and the active pattern 120. A pair of the interfacial layers 140 may be provided on the second regions R2 of the active pattern 120. The interfacial layers 140 may cover the top surface and the sidewalls of each of the second regions R2 of the active pattern 120. The interfacial layers

140 may not be disposed between the gate electrode GE and the first part P1 of the fin structure FS.

According to the present embodiments, the cladding layers 142 may include a same material as that of the active pattern 120. For example, the cladding layers 142 may include the third element. A third element content of each of the cladding layers 142 may be equal to or lower than that of the active pattern 120. In some elements, the cladding layers 142 may include silicon-germanium (SiGe), and the third element may be germanium (Ge). For example, each of the cladding layers 142 may include silicon-germanium (SiGe) having a germanium (Ge) content of above 0 atomic percent (at. %) to below 40 atomic percent (at. %) based on total silicon-germanium content in the cladding layers 142.

The interfacial layer 140 may include the third element. In some embodiments, the interfacial layer 140 may include a same material as that of each of the cladding layers 142 and the active pattern 120. A third element content of the interfacial layer 140 may be higher than that of each of the active pattern 120 and the cladding layers 142. In some embodiments, the interfacial layer 140 may include silicon-germanium (SiGe), e.g., the third element may be germanium (Ge). In some embodiments, the interfacial layer 140 may include silicon-germanium (SiGe) having a germanium (Ge) content of about 50 atomic percent (at. %) to below 100 atomic percent (at. %) based on total silicon-germanium content in the interfacial layer 140. In other embodiment, the interfacial layer 140 may ne a germanium (Ge) layer. The interfacial layer 140 may have a thickness of, e.g., about 2 Å to about 2 nm.

The capping layers 144 may be provide on the cladding layers 142, respectively. The capping layers 144 may be in contact with the cladding layers 142. The cladding layers 142 may respectively include a fourth element different from the third element, and the capping layers 144 may respectively include the fourth element. The fourth element may be silicon (Si). A fourth element content of each of the capping layers 144 may be higher than that of each of the cladding layers 142. In some embodiments, each of the cladding layers 142 may include silicon-germanium (SiGe), and each of the capping layers 144 may be a silicon (Si) layer.

The lower insulating layer 150 may be provided on the substrate 100 to cover at least sidewalls of the gate structure GS and the source/drain regions SD. The capping layers 144 may be interposed between the lower insulating layer 150 and the cladding layers 142.

An upper insulating layer may be disposed on the lower insulating layer 150. First contact plugs electrically connected to the source/drain regions SD and a second contact plug electrically connected to the gate electrode GE may be provided through the upper insulating layer and the lower insulating layer 150. The first contact plugs may be respectively provide in first contact holes passing through the upper insulating layer and the lower insulating layer 150 to expose the source/drain regions SD. The second contact plug may be provided in a second contact hole passing through the upper insulating layer and the lower insulating layer 150 to expose the gate electrode GE. The first and second contact holes may be formed by an etching process. When the first contact holes are formed, a portion of each of the cladding layers 142 and a portion of each of the capping layers 144 may be removed, and thus, the cladding layers 142 and the capping layers 144 may have a shape shown in FIG. 11, respectively.

Interconnection wiring layers may be disposed on the upper insulating layer to be in contact with the first contact plugs and the second contact plug. The interconnection wiring layers may be configured to apply voltages to the source/drain regions SD and the gate electrode GE via the first contact plugs and the second contact plug.

According to the present embodiment, the fin structure FS may include the buffer pattern 110*b* and the active pattern 120, and the lattice constant of the active pattern 120 may be greater than that of the buffer pattern 110*b*. Thus, the buffer pattern 110*b* may provide, e.g., impart, a compressive stress to the active pattern 120. A portion of the active pattern 120 may serve as the channel region of the transistor formed on the fin structure FS. In the case where the transistor is a P-type MOS field effect transistor, because the compressive stress may be provided to the active pattern 120 by the buffer pattern 110*b*, the channel characteristics of the P-type MOS field effect transistor may be improved.

Further, the fin structure FS may include the first part P1 under the gate structure GS and the second parts P2 at both sides of the gate structure GS. The top surface of the first part P1 may be substantially coplanar with the top surfaces of the second parts P2. The cladding layers 142 may be the epitaxial layers that are uniformly grown using the second parts P2 as seeds. As a result, because the cladding layers 142 may be uniformly grown on the fin structure FS, it is possible that a semiconductor device having a highly improved reliability may be embodied.

Figure 13:
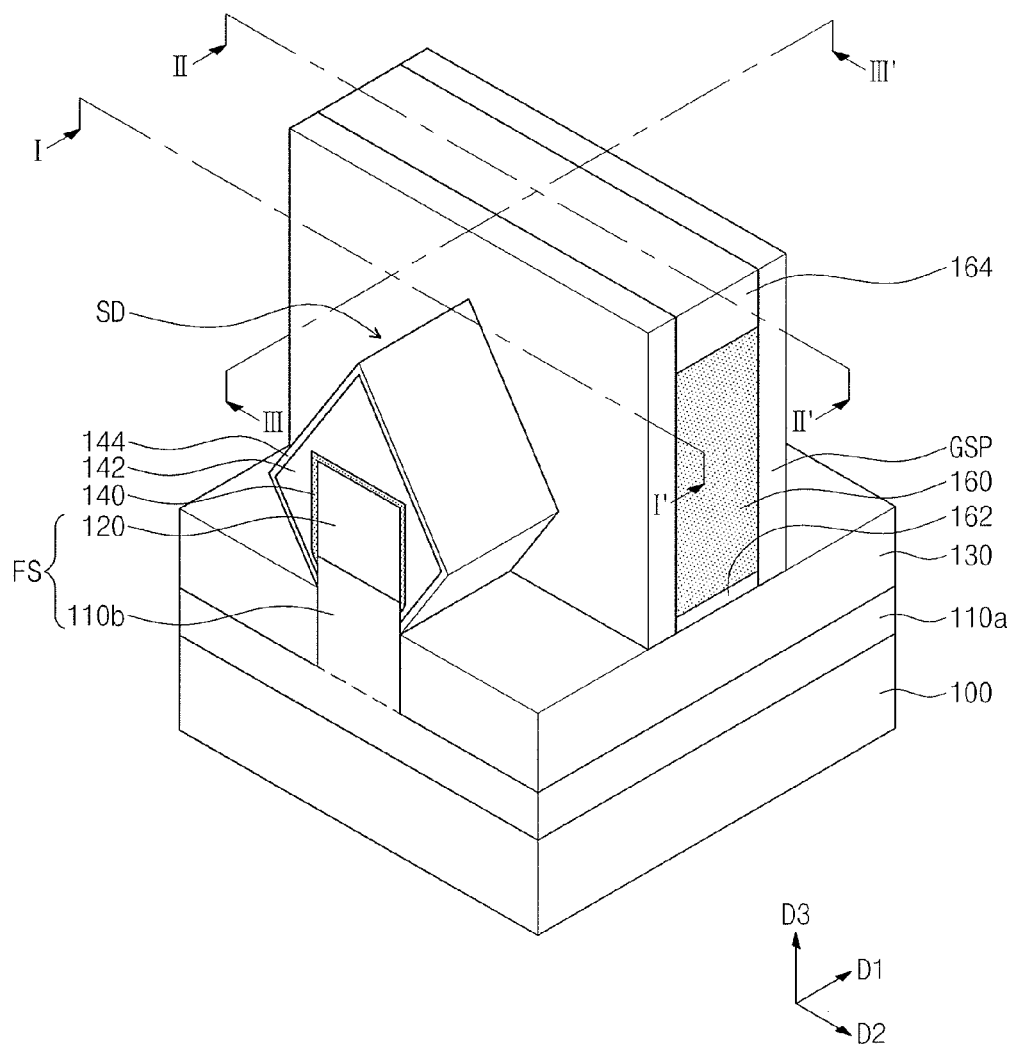
FIG. 13 is a perspective view illustrating a stage in a method of manufacturing a semiconductor device according to example embodiments.
Figure 14:
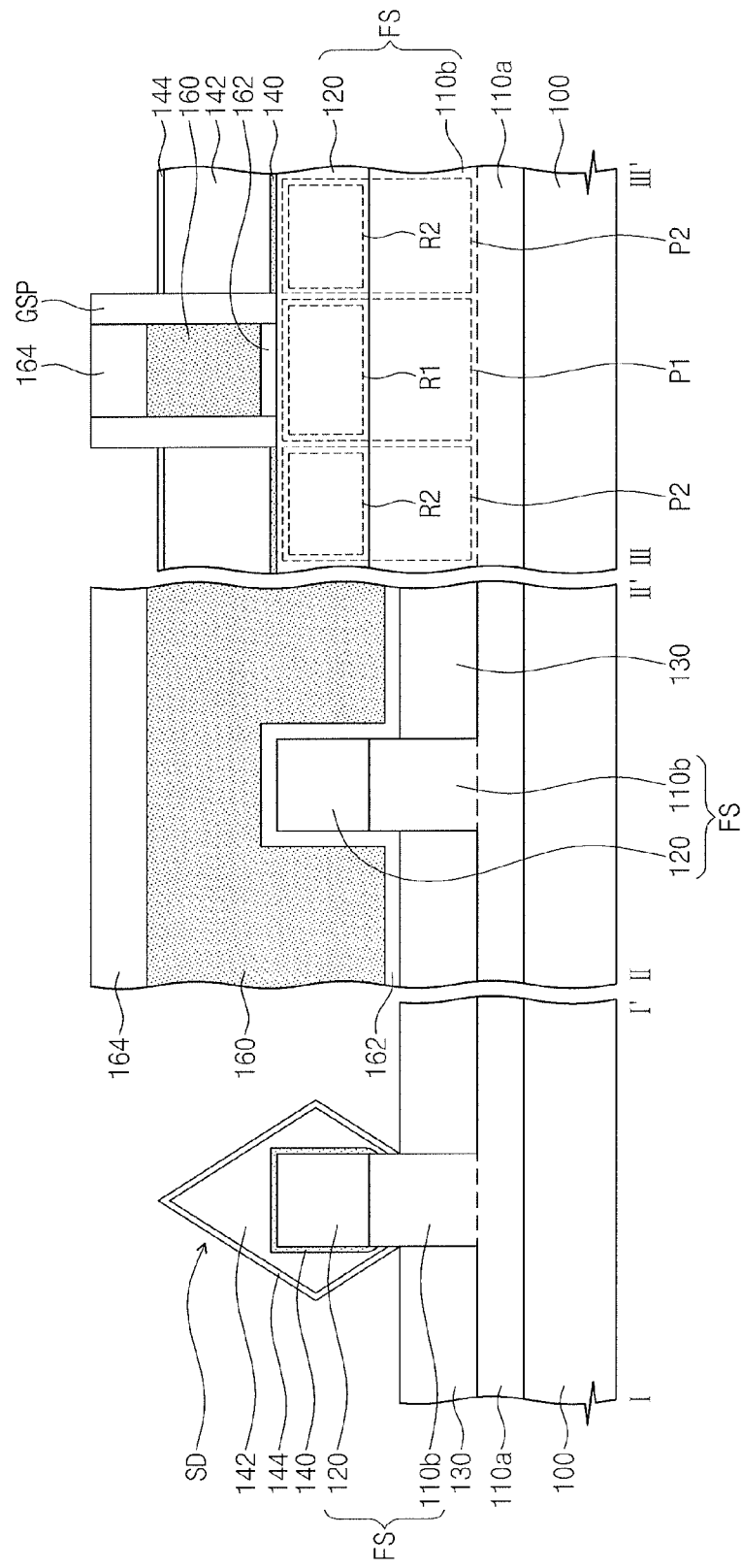
FIG. 14 illustrates cross-sectional views taken along lines I-I', II-II', and III-III' of FIG. 13.

FIG. 13 is a perspective view illustrating a method for manufacturing a semiconductor device according to example embodiments. FIG. 14 illustrate cross-sectional views taken along lines I-I', II-II', and III-III' of FIG. 13. Hereinafter, the descriptions to the same elements as described in the embodiments illustrated in FIGS. 3 through 10 will be omitted or mentioned briefly for the purpose of ease and convenience in explanation.

First, as described with reference to FIGS. 3 and 4, the buffer layer 110*a* may be formed on the substrate 100, and the fin structure FS extending in the first direction D1 may be formed on the buffer layer 110*a*. The fin structure FS may include the buffer pattern 110*b* protruding upwardly from the buffer layer 110*a* and extending in the first direction D1, and the active pattern 120 disposed on the buffer pattern 110*b* and extending in the first direction D1. The formation of the fin structure FS may include forming a preliminary buffer layer and an active layer sequentially stacked on the substrate 100 and forming trenches T defining the fin structure FS by patterning the active layer and the preliminary buffer layer.

The preliminary buffer layer may have a lattice constant different from that of the substrate 100. The preliminary buffer layer may include material having a lattice constant greater than that of the substrate 100. As an example, the substrate may be a silicon substrate, and the preliminary buffer layer may include silicon-germanium (SiGe).

The active layer may have a lattice constant different from that of the preliminary buffer layer. In the present embodiments, the active layer may include material having the lattice constant greater than that of the preliminary buffer layer. The active layer and the preliminary buffer layer may include a same material. The active layer and the preliminary buffer layer may include a third element. The third element content of the active layer may be higher than that of the preliminary buffer layer. As an example, the active layer and the preliminary buffer layer may include silicon-germanium (SiGe), e.g., the third element may be germanium (Ge). Thus, the preliminary buffer layer may provide a compressive stress to the active layer. In some embodiments, the active layer may be formed by a selective epitaxial growth (SEG) process using the preliminary buffer layer as a seed.

The isolation layers 130 may be at both sides of the fin structure FS. The isolation layers 130 may be formed to fill the trenches T. Upper portion of the fin structure FS may be exposed by recessing upper portions of the isolation layers 130. By the recessing process, at least a portion of the active pattern 120 may be exposed by the isolation layers 130.

Next, as described with reference to FIGS. 5 and 6, the sacrificial gate pattern 160 may be formed on the substrate 100 to cross over the fin structure FS. The gate mask pattern 164 extending in the second direction D2 may be formed on the sacrificial gate pattern 160, and the etch stop pattern 162 extending in the second direction D2 may be formed under the sacrificial gate pattern 160.

As the gate pattern 160 may be formed to cross over the fin structure FS, the first part P1 and the second parts P2 may be defined in the fin structure FS. The first part P1 of the fin structure FS may be positioned under the sacrificial gate pattern 160 and may be vertically overlapped with the sacrificial gate pattern 160. The second parts P2 of the fin structure FS may be positioned at both sides of the sacrificial gate pattern 160 and may be horizontally separated from each other by the first part P1. The top surface of the first part P1 may be substantially coplanar with the top surfaces of the second parts P2.

Further, as the sacrificial gate pattern 160 may be formed to cross over the fin structure FS, the first region R1 and the second regions R2 may be defined in the active pattern 120. The first region R1 of the active pattern 120 may be positioned under the sacrificial gate pattern 160 and may be vertically overlapped with the sacrificial gate pattern 160. The second regions R2 of the active pattern 120 may be positioned at the both sides of the sacrificial gate pattern 160 and may be horizontally separated from each other by the first region R1. The first region R1 of the active pattern 120 may correspond to an upper portion of the first part P1 of the fin structure FS. The second regions R2 of the active pattern 120 may correspond to upper portions of the second parts P2 of the fin structure FS, respectively. The top surface of the first region R1 may be substantially coplanar with the top surfaces of the second regions R2. Gate spacers GSP may be formed on both sidewalls of the sacrificial gate pattern 160, respectively.

Referring to FIGS. 13 and 14, the cladding layers 142 may be formed at both sides of the sacrificial gate pattern 160. The cladding layers 142 may be formed on the second parts P2 of the fin structure FS, respectively. Each of the cladding layers 142 may cover the top surface and sidewalls of each of the second part P2 of the fin structure FS. That is, each of the cladding layers 142 may cover the top surface and sidewalls of each of the second regions R2 of the active pattern 120. The formation of the cladding layers 142 may include performing a selective epitaxial growth (SEG) process using the fin structure FS exposed by the isolation layers 130 as a seed.

The cladding layers 142 may include a same material as that of the fin structure FS. The active pattern 120 and the cladding layers 142 may include the third element. The third element content of each of the cladding layers 142 may be substantially equal to or lower than that of the active pattern 120. As an example, the cladding layers 142 may include silicon-germanium (SiGe), and the third element may be germanium. For example, the cladding layers 142 may include silicon-germanium having a germanium content of above 0 atomic percent (at. %) to 40 atomic percent (at. %) based on total content of the silicon-germanium in the cladding layers 142.

An interfacial layer 140 may be formed between each of the cladding layers 142 and the fin structure FS. The interfacial layer 140 may be interposed between each of the cladding layers 142 and the active pattern 120. A pair of the interfacial layers 140 may be formed on second regions R2 of the active patterns 120, respectively. The interfacial layer 140 may cover the top surface and the sidewalls of each of the second region R2 of the active pattern 120.

The interfacial layer 140 may include the third element. The interfacial layer 140 may include a same material as that of each of the active pattern 120 and the cladding layers 142. The third element content in each of the interfacial layer 140 may be substantially equal to or higher than that in each of the active pattern 120 and the cladding layers 142. As an example, the interfacial layer 144 may include silicon-germanium (SiGe), and the third element may be germanium. In some embodiments, the interfacial layer 140 may include silicon-germanium having a germanium content of 50 atomic percent (at. %) to below 100 atomic percent (at. %) based on total content of the silicon-germanium in the interfacial layers 142. In other embodiments, the interfacial layer 140 may be a germanium (Ge). The interfacial layer 140 may be formed using the same process as described with reference to FIGS. 7 and 8.

Capping layers 144 may be formed on the cladding layers 142, respectively. Each of the capping layers 144 may be formed to cover the surface of each of the cladding layers 142. The cladding layers 142 may further include a fourth element different from the third element. The capping layers 144 may include the fourth element. The fourth element may be, e.g., silicon (Si). A fourth element content of each of the capping layers 144 may be higher than that of each of the cladding layers 142. As an example, the cladding layers 142 may include silicon-germanium (SiGe), and the capping layers 144 may be silicon (Si) layers. Each of the capping layers 144 may be formed using a selective epitaxial growth process using each of the cladding layers 142 as a seed.

The source/drain regions SD may be formed by doping the cladding layers 142 with impurities. As an example, during the selective epitaxial growths of the cladding layers 142, the cladding layers 142 may be concurrently doped with p-type impurities, e.g., boron (B). As another example, the cladding layers 142 may be doped with p-type impurities, e.g., boron (B), after the cladding layers 142 is formed. In some embodiments, a portion of the fin structure FS and/or at least a portion of each of the capping layers 144 may be doped while the cladding layers 142 are doped with impurities. Accordingly, each of the source/drain regions SD may be formed in each of the cladding layers 142, each of the capping layers 144, and/or the fin structures FS. As a result, the source/drain regions SD may be provided at both sides of the sacrificial gate pattern 160. Each of the source/drain regions SD may include at least a portion of each of the cladding layers 142, at least a portion of each of the capping layers 144, and/or a portion of the fin structure FS. The source/drain regions SD may be provided on the second parts P2 of the fin structure FS. Next, the same processes as that of manufacturing the semiconductor device according to the embodiments described with reference to FIGS. 9 and 10, and FIGS. 1 and 2 may be performed.

According to example embodiments, the fin structure FS may include the buffer pattern 110b and the active pattern 120. The lattice constant of the active pattern 120 may be different from that of the buffer pattern 110b. Thus, the buffer pattern 110b may provide the tensile stress or the compressive stress to the active pattern 120. A portion of the active pattern 120 may serve as the channel region of the transistor formed on the fin structure FS. Due to the tensile stress or the compressive stress provided to the active pattern 120 by the buffer pattern 110b, the channel characteristics of the semiconductor device, e.g., a p-type MOS field effect transistor or an n-type MOS field effect transistor, may be improved.

Further, the fin structure FS may include the first part P1 under the gate structure GS and the second parts P2 at both sides of the gate structure GS. The top surface of the first part P1 may be substantially coplanar with the top surfaces of the second parts P2. The cladding layers 142 may be the epitaxial layers that are uniformly grown using the second parts P2 as seeds. As a result, because the cladding layers 142 may be uniformly grown on the fin structure FS, a semiconductor device having a highly improved reliability may be provided.

Figure 15:
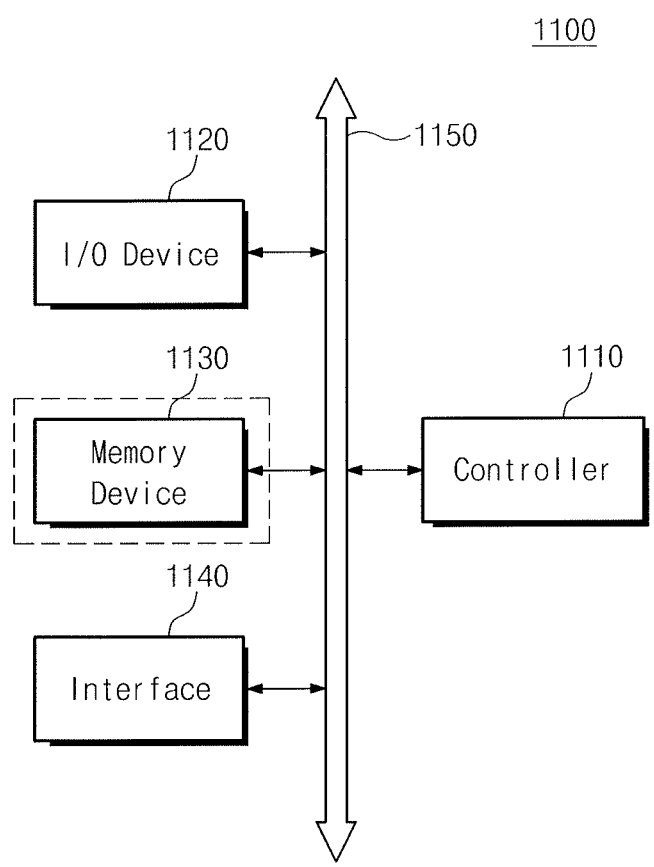
FIG. 15 is a schematic block diagram illustrating an electronic system including a semiconductor device according to example embodiments.

FIG. 15 is a schematic block diagram illustrating an electronic system including a semiconductor device according to example embodiments.

Referring to FIG. 15, an electronic system 1100 according to example embodiments may include a controller 1110, an input/output (I/O) unit 1120, a memory device 1130, an interfacial unit 1140, and a data bus 1150. At least two of the controller 1110, the I/O unit 1120, the memory device 1130, and the interfacial unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The interfacial unit 1140 may transmit electrical data to a communication network or may receive electrical data from a communication network. The interfacial unit 1140 may operate by wireless or cable. For example, the interfacial unit 1140 may include an antenna a wireless/cable transceiver. Although not shown in the drawings, the electronic system 1100 or controller 1110 may further include a fast dynamic random access memory (DRAM) device and/or a fast static random access memory (SRAM) device which acts as a cache memory or a working memory for improving an operation of the controller 1110. At least one of the semiconductor devices according to the aforementioned example embodiments may be provided into at least one of the memory device 1130, the controller 1110, or the I/O unit 1120.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a buffer layer on a substrate, the buffer layer having a lattice constant different from that of the substrate;
a fin structure upwardly protruding from the buffer layer;
a gate electrode crossing over the fin structure;
a cladding layer at a side of the fin structure and covering a top surface and sidewalls of the fin structure; and
an interfacial layer between the cladding layer and the fin structure, the interfacial layer including a same element as the buffer layer.

2. The device as claimed in claim 1, wherein the fin structure includes:
a buffer pattern upwardly protruding from the buffer layer and extending in a first direction; and
an active pattern on the buffer pattern and extending in the first direction, the active pattern having a lattice constant different from that of the buffer pattern, and the buffer pattern being between the active pattern and the buffer layer.

3. The device as claimed in claim 2, wherein:
the fin structure includes a first part under the gate electrode and a second part at a side of the gate electrode, a top surface of the first part being substantially coplanar with a top surface of the second part, and
the cladding layer is on the second part to cover a top surface and sidewalls of the active pattern, the interfacial layer being between the cladding layer and the second part of the active pattern.

4. The device as claimed in claim 2, wherein the buffer pattern includes material having a same lattice constant as that of the buffer layer, the buffer pattern and the buffer layer provide a tensile stress to the active pattern.

5. The device as claimed in claim 4, wherein the interfacial layer includes an element different from an element that constitutes each of the active pattern and the cladding layer.

6. The device as claimed in claim 5, wherein the active pattern and the cladding layer include silicon, and the interfacial layer and the buffer layer include germanium.

7. The device as claimed in claim 2, wherein the buffer pattern includes a material having a same lattice constant as that of the buffer layer, the buffer layer and the buffer pattern provide a compressive stress to the active pattern.

8. The device as claimed in claim 7, wherein the active pattern, the cladding layer, the interfacial layer, and the buffer layer include germanium, a germanium content of the interfacial layer being higher than that of each of the active pattern and the cladding layer.

9. The device as claimed in claim 8, wherein a germanium content of the buffer layer is lower than that of the active pattern.

10. A semiconductor device, comprising:
a fin structure protruding from a lower layer and extending in a first direction;
isolation layers at opposite sides of the fin structure and extending in the first direction;
a gate electrode crossing over the fin structure and extending in a second direction crossing the first direction;
cladding layers on the fin structure at opposite sides of the gate electrode; and
an interfacial layer between the fin structure and each of the cladding layers, the interfacial layer not provided between the gate electrode and the fin structure, wherein the fin structure includes a first part under the gate electrode and second parts at the opposite sides of the gate electrode, each of the cladding layers being on a respective second part, and a top surface of the first part being substantially coplanar with top surfaces of the second parts.

11. The device as claimed in claim 10, wherein:
each of the second parts of the fin structures includes sidewalls exposed by the isolation layers,
each of the cladding layers covers the top surface and the sidewalls of the second parts, and
the interfacial layer is between each of the cladding layers and each of the second parts, and is not between the first part and the gate electrode.

12. The device as claimed in claim 10, wherein:
the lower layer includes a substrate and a buffer layer on the substrate, the buffer layer having a lattice constant different from that of the substrate,
the fin structure includes an active pattern extending in the first direction and having a lattice constant different from the buffer layer, and a buffer pattern connected to the buffer layer,
the buffer pattern is between the active pattern and the buffer layer, and
the isolation layers expose at least a portion of the active pattern.

13. The device as claimed in claim 12, wherein:
the active pattern includes a first region under the gate electrode and second regions at the opposite sides of the gate electrode,
each of the second regions has a top surface and sidewalls exposed by the isolation layers,
each of the cladding layers covers the top surface and the sidewalls of each of the second regions, and
the interfacial layer is between each of the cladding layers and each of the second regions, and is disposed on the top surface and the sidewalls of each of the second regions.

14. The device as claimed in claim 12, wherein the interfacial layer includes a same element as the buffer pattern.

15. The device as claimed in claim 12, wherein:
the buffer pattern provides a tensile stress to the active pattern,
the active pattern and the cladding layers including a first element, and
the interfacial layer and the buffer pattern including a second element different from the first element.

16. The device as claimed in claim 15, wherein the first element is silicon, and the second element is germanium.

17. The device as claimed in claim 12, wherein:
the buffer pattern provides a compressive stress to the active pattern, the active pattern, the cladding layers, the interfacial layer, and the buffer pattern include a first element, respectively, and
a first element content of the interfacial layer is higher than that of each of the active pattern and the cladding layers.

18. The device as claimed in claim 17, wherein the first element is germanium.

19. The device as claimed in claim 17, further comprising capping layers on the cladding layers, respectively,
wherein the cladding layers and the capping layers include a second element different from the first element, and
wherein a second element content of each of the capping layers is higher than that of each of the cladding layers.

20. The device as claimed in claim 19, wherein the second element is silicon.

21. A semiconductor device, comprising:
a buffer layer on a substrate, the buffer layer having a lattice constant different from that of the substrate;
a fin structure upwardly protruding from the buffer layer, the fin structure including:
a buffer pattern at a bottom of the fin structure and extending upwardly from the buffer layer, and
an active pattern on the buffer pattern, the active pattern having a lattice constant different from that of the buffer pattern;
a gate electrode crossing over the fin structure;
a cladding layer covering portions of a top surface and sidewalls of the fin structure; and
an interfacial layer between the cladding layer and the fin structure, the interfacial layer including a same material as the buffer layer.

22. The device as claimed in claim 21, wherein the interfacial layer is directly between the cladding layer and the fin structure, the cladding layer being an epitaxial layer at opposite sides of the gate electrode.

23. The device as claimed in claim 22, wherein the cladding layer completely covers a top surface and sidewalls of the active pattern, the interfacial layer completely separating between the cladding layer and the active pattern.

24. The device as claimed in claim 21, wherein the buffer pattern is integral with and consists of a same material as the buffer layer, the lattice constant of the active pattern being smaller than that of the buffer pattern.

25. The device as claimed in claim 24, wherein:
the active pattern and the cladding layer include a same material, at least a portion of the cladding layer defining a source/drain region, and
the interfacial layer includes a different material than the active pattern and the cladding layer.

* * * * *